US010651029B2

(12) United States Patent
Takahashi et al.

(10) Patent No.: US 10,651,029 B2
(45) Date of Patent: May 12, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Hiroaki Takahashi, Kyoto (JP); Kazunori Fujikawa, Kyoto (JP); Tomonori Kojimaru, Kyoto (JP); Tomomasa Ishida, Kyoto (JP); Ayumi Higuchi, Kyoto (JP); Naozumi Fujiwara, Kyoto (JP); Kana Komori, Kyoto (JP); Shota Iwahata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/388,281

(22) Filed: Dec. 22, 2016

(65) Prior Publication Data

US 2017/0186599 A1    Jun. 29, 2017

(30) Foreign Application Priority Data

Dec. 24, 2015   (JP) ................................. 2015-252297

(51) Int. Cl.
  *H01L 21/67*    (2006.01)
  *H01L 21/306*   (2006.01)
  (Continued)

(52) U.S. Cl.
  CPC .. *H01L 21/02052* (2013.01); *H01L 21/02057* (2013.01); *H01L 21/30604* (2013.01);
  (Continued)

(58) Field of Classification Search
  CPC ......... H01L 21/02052; H01L 21/67034; H01L 21/30604; H01L 21/324; H01L 21/68792;
  (Continued)

(56) References Cited

U.S. PATENT DOCUMENTS

2008/0078426 A1   4/2008   Miya et al. ...................... 134/30
2009/0073394 A1   3/2009   Miyagi et al. ................... 355/27
(Continued)

FOREIGN PATENT DOCUMENTS

JP   2001-053051 A   2/2001
JP   2009-071026 A   4/2009
(Continued)

OTHER PUBLICATIONS

Fax Transmission of claim amendment received on Apr. 6, 2018.*
English Translation of JP 2008096725 (Year: 2008).*

*Primary Examiner* — Duy Vu N Deo
*Assistant Examiner* — Mahmoud Dahimene
(74) *Attorney, Agent, or Firm* — Ostrolenk Faber LLP

(57) ABSTRACT

The controller is programmed to cause a low-surface-tension liquid supply unit to supply a liquid film of a low-surface-tension liquid to a front surface of a substrate so as to form a liquid film of the low-surface-tension liquid. The controller is programmed to control the substrate rotating unit and the inert gas supply unit so that an inert gas is supplied toward the rotational center position while rotating the substrate, thereby forming an opening spreading from the rotational center position to be formed in the liquid film, and enlarging the opening in a direction away from the rotational center position, and to control the landing-position changing unit to change the landing position of the low-surface-tension liquid to at least two positions except the rotational center position in accordance with enlargement of the opening so that the landing position is placed outside the peripheral edge of the opening.

16 Claims, 15 Drawing Sheets

(51) Int. Cl.
*H01L 21/02* (2006.01)
*H01L 21/687* (2006.01)
*H01L 21/324* (2006.01)

(52) U.S. Cl.
CPC ........ *H01L 21/324* (2013.01); *H01L 21/6708* (2013.01); *H01L 21/67028* (2013.01); *H01L 21/67034* (2013.01); *H01L 21/67051* (2013.01); *H01L 21/67109* (2013.01); *H01L 21/68792* (2013.01)

(58) Field of Classification Search
CPC ........... H01L 21/67109; H01L 21/6708; H01L 21/67051; H01L 21/02057; H01L 21/67028
See application file for complete search history.

(56) References Cited

U.S. PATENT DOCUMENTS

| | | | |
|---|---|---|---|
| 2009/0205684 A1 | 8/2009 | Orii et al. | 134/33 |
| 2009/0250079 A1 | 10/2009 | Yoshihara et al. | 134/4 |
| 2009/0311632 A1* | 12/2009 | Takeguchi | G03F 7/3021 430/322 |
| 2011/0240601 A1 | 10/2011 | Hashizume et al. | 216/83 |
| 2012/0045581 A1* | 2/2012 | Kimura | H01L 21/02057 427/248.1 |
| 2012/0103371 A1 | 5/2012 | Yun et al. | 134/26 |
| 2012/0160274 A1 | 6/2012 | Kasai et al. | 134/26 |
| 2012/0164840 A1 | 6/2012 | Tanaka et al. | 438/745 |
| 2012/0175819 A1* | 7/2012 | Miya | H01L 21/02052 264/334 |
| 2012/0234362 A1* | 9/2012 | Yoshihara | B08B 3/024 134/33 |
| 2013/0174873 A1 | 7/2013 | Yoshihara et al. | 134/19 |
| 2013/0233356 A1 | 9/2013 | Obweger et al. | 134/33 |
| 2014/0053869 A1* | 2/2014 | Chen | C11D 11/0047 134/6 |
| 2014/0065295 A1 | 3/2014 | Emoto et al. | 427/8 |
| 2014/0174483 A1* | 6/2014 | Miya | H01L 21/67028 134/30 |
| 2014/0299161 A1 | 10/2014 | Tanaka et al. | 134/30 |
| 2015/0090297 A1* | 4/2015 | Matsushita | H01L 21/67028 134/19 |
| 2015/0090298 A1 | 4/2015 | Nagashima et al. | 134/19 |
| 2015/0194301 A1 | 7/2015 | Uemura et al. | |
| 2015/0279708 A1 | 10/2015 | Kobayashi et al. | 438/737 |
| 2016/0071746 A1* | 3/2016 | Hayashi | H01L 21/67051 438/16 |
| 2016/0096203 A1* | 4/2016 | Kai | H01L 21/6708 134/30 |

FOREIGN PATENT DOCUMENTS

| | | | | |
|---|---|---|---|---|
| JP | 2010-050143 A | 3/2010 | | |
| JP | 2010-177371 | 8/2010 | | |
| JP | 2011-216608 A | 10/2011 | | |
| JP | 2013-140881 A | 7/2013 | | |
| JP | 2013-542607 A | 11/2013 | | |
| JP | 2014-017393 | 1/2014 | | |
| JP | 2014-090015 | 5/2014 | | |
| JP | 2014-179525 A | 9/2014 | | |
| JP | 2014-197571 A | 10/2014 | | |
| JP | WO 2014157180 A1 * | 10/2014 | ....... | H01L 21/67051 |
| JP | 2014-209605 A | 11/2014 | | |
| JP | 2015-516675 A | 6/2015 | | |
| JP | 2015-133347 | 7/2015 | | |
| KR | 10-2008-0029779 A | 4/2008 | | |
| TW | 201231177 A1 | 8/2012 | | |
| TW | 201234454 A | 8/2012 | | |
| TW | 201249554 A1 | 12/2012 | | |
| TW | 201342458 A | 10/2013 | | |
| TW | 201506994 A | 2/2015 | | |
| TW | 201523724 A | 6/2015 | | |
| TW | 201539628 A | 10/2015 | | |

* cited by examiner

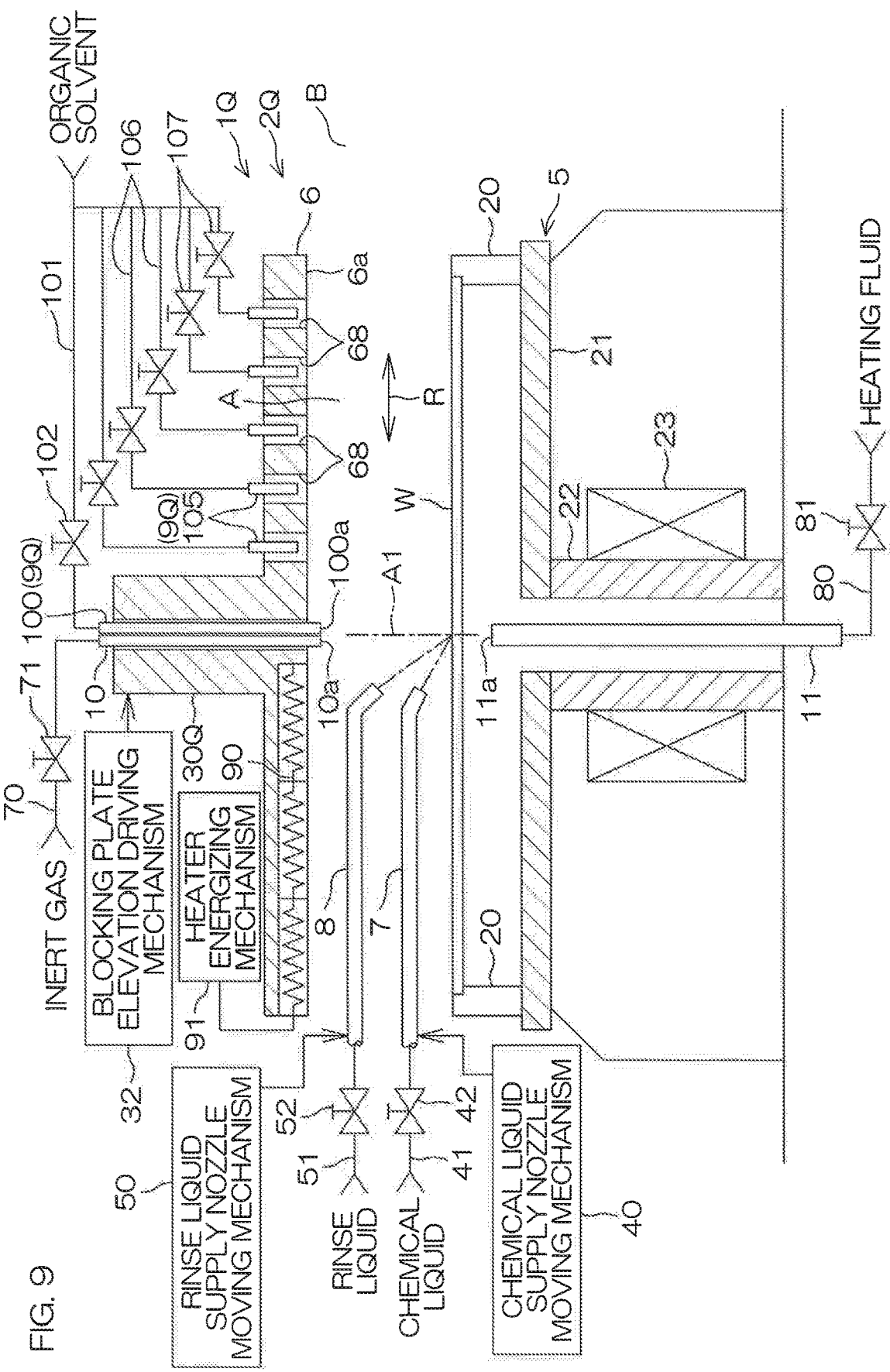

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for processing a substrate by use of liquids. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of the Related Art

For example, a chemical liquid is supplied to a substrate substantially horizontally held by a spin chuck in a substrate processing operation that employs a single substrate processing type in which substrates are processed one by one. Thereafter, a rinse liquid is supplied to the substrate, and, as a result, the chemical liquid present on the substrate is replaced with the rinse liquid. Thereafter, a spin dry step of excluding the rinse liquid present on the substrate is performed.

As shown in FIG. 14 of Japanese Patent Application Publication No. 2010-177371, when a fine pattern is formed on the front surface of the substrate, a liquid surface (interface between air and the liquid) is formed inside the pattern in the spin dry step. In this case, the surface tension of the liquid acts on a contact position between the liquid surface and the pattern. If this surface tension is large, a pattern collapse is liable to occur. The surface tension of water, which is a typical rinse liquid, is large, and therefore the pattern collapse in the spin dry step is non-negligible.

Therefore, a technique has been proposed in which water that has entered the inside the pattern is replaced with IPA (isopropyl alcohol) by supplying IPA that is a low-surface-tension liquid lower in surface tension than water, and IPA is then removed, and, as a result, the front surface of the substrate is dried.

For example, a liquid film of IPA is formed by supplying IPA onto the upper surface of the substrate. Thereafter, a nitrogen gas is sprayed onto a central part of the upper surface of the substrate being rotated around a rotational center that passes through the central part of the substrate. Therefore, IPA is removed from the central part of the upper surface of the substrate, and, as a result, a hole is formed (Japanese Patent Application Publication No. 2010-177371). Thereafter, the inner diameter of the annular liquid film is enlarged by means of a centrifugal force generated by the rotation of the substrate or by means of a spraying force of the nitrogen gas. Therefore, the liquid film is excluded outwardly from the substrate, and, as a result, the front surface of the substrate is dried.

On the other hand, there is a case in which IPA is discharged from an IPA discharge nozzle while performing scanning by moving a nozzle head that has both the IPA discharge nozzle and a nitrogen gas discharge nozzle from the center of a substrate toward its peripheral edge (United States Patent Application Publication No. 2009/0205684 A1). As a result, the liquid film of IPA supplied to the substrate is pushed outwardly from the substrate by means of the centrifugal force and the spraying force of the nitrogen gas. Therefore, the front surface of the substrate is dried.

SUMMARY OF THE INVENTION

In the substrate processing apparatus disclosed by Japanese Patent Application Publication No. 2010-177371, when the liquid film of IPA is removed, IPA is allowed to land on a predetermined position that is away from the rotational center of the substrate by a fixed distance, and is allowed to stop being supplied when the inner periphery of the liquid film of IPA reaches the predetermined position. Therefore, there is a fear that, after the supply of IPA is stopped, the liquid film of IPA will tear, and liquid droplets of IPA will remain on the substrate. In detail, IPA does not evenly evaporate from the liquid film of IPA, and a part of the liquid film of IPA completely evaporates, so that the substrate is exposed. This causes a fear that the liquid film will tear. The centrifugal force with respect to the liquid film is large in the peripheral edge of the substrate, and is small in an area closer to the rotational center. Moreover, the linear speed of the liquid film in a rotational direction is large in the peripheral edge of the substrate, and therefore the relative speed between the liquid film and atmosphere is large, and evaporation progresses swiftly. Therefore, there is a fear that one liquid-film part present on the peripheral edge of the substrate will separate from one other liquid-film part present on an inner side than the one liquid-film part, and will be excluded outwardly from the substrate.

On the other hand, in the substrate processing apparatus of United States Patent Application Publication No. 2009/0205684 A1, when scanning is performed by moving the nozzle head from the center of the substrate toward its peripheral edge, the drying of IPA is assisted by a nitrogen gas discharged from the nitrogen gas discharge nozzle. Therefore, an annular liquid film of IPA is pushed out in the rotational radial direction of the substrate by means of the nitrogen gas discharged at a position that is away from the rotational center of the substrate. Therefore, the spraying force of the nitrogen gas locally acts on a part of the inner periphery of the annular liquid film of IPA, and hence becomes uneven with respect to the circumferential direction around the rotational center of the substrate. This causes a fear that the liquid film of IPA will tear, and liquid droplets of IPA will remain on the substrate.

The liquid droplets of IPA remaining on the substrate enter a fine pattern on the substrate, and continue to exert surface tension on the fine pattern for a long time along with water that has merged into the liquid droplets of IPA. Therefore, energy applied by the surface tension onto the pattern becomes large until those liquid droplets are finally dried. This causes a fear that a pattern collapse will occur.

Therefore, it is an object of the present invention to provide a substrate processing apparatus and a substrate processing method capable of swiftly drying the front surface of a substrate while restraining a low-surface-tension liquid from remaining on the substrate.

The present invention provides a substrate processing apparatus including a substrate holding unit that horizontally holds a substrate, a substrate rotating unit that rotates the substrate held by the substrate holding unit around a predetermined rotational axis extending in a vertical direction, a processing liquid supply unit that supplies a processing liquid including water to a front surface of the substrate held by the substrate holding unit, a low-surface-tension liquid supply unit that supplies a low-surface-tension liquid whose surface tension is smaller than water to the front surface of the substrate held by the substrate holding unit, a landing-position changing unit that changes a landing position on the front surface of the substrate at which the low-surface-tension liquid supplied from the low-surface-tension liquid supply unit lands, an inert gas supply unit that supplies an inert gas toward a rotational center position that is a position existing on the rotational axis on the front surface of the substrate, and a controller that controls the substrate rotating unit, the processing liquid supply unit, the low-surface-tension liquid supply unit, the landing-position changing unit, and the inert gas supply unit. The controller is programmed to cause the processing liquid supply unit to supply a processing liquid to the front surface of the substrate, and to cause the low-surface-tension liquid supply unit to supply a low-surface-tension liquid to the front surface of the substrate so as to form a liquid film of the low-surface-tension liquid on the front surface of the substrate by replacing the processing liquid with the low-surface-tension liquid, to control the substrate rotating unit and the inert gas supply unit so that an inert gas is supplied from the inert gas supply unit toward the rotational center position while rotating the substrate by means of the substrate rotating unit, thereby forming an opening spreading from the rotational center position to be formed in the liquid film of the low-surface-tension liquid, and enlarging the opening in a direction away from the rotational center position, and to control the landing-position changing unit to change the landing position of the low-surface-tension liquid to at least two positions except the rotational center position in accordance with enlargement of the opening so that the landing position is placed outside the peripheral edge of the opening.

According to this arrangement, when the opening is enlarged in a direction away from the rotational center position, an inert gas is supplied toward the rotational center position. Therefore, it is possible to evenly expand the opening from the rotational center position while quickly drying a low-surface-tension liquid at the peripheral edge of the opening. Additionally, the landing position is changed to at least two places in accordance with the enlargement of the opening so that the landing position of the low-surface-tension liquid is placed outside the peripheral edge of the opening. Therefore, the low-surface-tension liquid is satisfactorily supplied to an area outside the peripheral edge of the opening. Therefore, the low-surface-tension liquid outside the peripheral edge of the opening is restrained from locally disappearing because of evaporation or a centrifugal force. Therefore, it is possible to exclude the liquid film outwardly from the substrate while restraining or preventing the liquid film from being torn. Therefore, a low-surface-tension liquid or processing liquid that has merged into the low-surface-tension liquid is restrained or prevented from remaining on the substrate in the form of liquid droplets. Thus, it is possible to swiftly dry the front surface of the substrate while restraining a low-surface-tension liquid and the like from remaining on the front surface of the substrate. Thereby, a period of time during which surface tension caused by a low-surface-tension liquid or by processing liquid that has merged into the low-surface-tension liquid acts is shortened.

In one preferred embodiment of the present invention, the controller is programmed to cause the landing-position changing unit to move the landing position so that a distance between the peripheral edge of the opening and the landing position is kept constant. According to this arrangement, in a process in which the opening is enlarged, the distance between the peripheral edge of the opening and the landing position is kept constant. Therefore, the liquid film of the low-surface-tension liquid that has become annular by the formation of the opening is more reliably restrained or prevented from being locally dried and being torn.

In one preferred embodiment of the present invention, the low-surface-tension liquid supply unit includes a nozzle that supplies a low-surface-tension liquid toward the front surface of the substrate. The landing-position changing unit includes a nozzle moving unit that moves the nozzle in a direction along the front surface of the substrate. According to this arrangement, it is possible to arbitrarily set and change the landing position by allowing the nozzle moving unit to move the nozzle in a direction along the front surface of the substrate. It is possible to change the landing position in a non-stepwise manner if the nozzle is moved in a non-stepwise manner. This makes it possible to cause the landing position to faithfully follow the enlargement of the opening of the liquid film.

In one preferred embodiment of the present invention, the low-surface-tension liquid supply unit includes a plurality of nozzles respectively disposed at a plurality of positions differing from each other in distance from the rotational center position. The landing-position changing unit includes a supply switching unit that performs switching between supply and non-supply of a low-surface-tension liquid to the plurality of nozzles.

According to this arrangement, it is possible to change the landing position by means of a simple structure in which switching between supply and non-supply of a low-surface-tension liquid to the plurality of nozzles is performed by the supply switching unit.

The plurality of nozzles may be arranged side by side along a rotational radial direction of the substrate.

In one preferred embodiment of the present invention, the substrate processing apparatus further includes a facing member that has a facing surface facing the front surface of the substrate held by the substrate holding unit and that isolates a space between the facing surface and the front surface of the substrate from a circumambient atmosphere. According to this arrangement, the space between the facing surface of the facing member and the front surface of the substrate is isolated from the circumambient atmosphere. Therefore, the low-surface-tension liquid does not easily evaporate outside the opening. This makes it possible to further restrain the liquid film of the low-surface-tension liquid from being torn.

In one preferred embodiment of the present invention, the substrate processing apparatus further includes a facing member that has a facing surface facing the front surface of the substrate held by the substrate holding unit and that isolates a space between the facing surface and the front surface of the substrate from a circumambient atmosphere. Additionally, a plurality of supply ports corresponding to the plurality of nozzles, respectively, are formed in the facing surface, and a low-surface-tension liquid is supplied from the plurality of supply ports to the front surface of the substrate.

According to this arrangement, a low-surface-tension liquid is supplied from the supply ports formed in the facing surface of the facing member to the front surface of the substrate. Therefore, there is no need to secure an interval to dispose a plurality of nozzles between the facing member and the substrate when a low-surface-tension liquid is supplied from the nozzle to the substrate. Therefore, it is possible to bring the facing member close to the substrate, and therefore it is possible to further restrain the low-surface-tension liquid outside the peripheral edge of the opening from evaporating.

In one preferred embodiment of the present invention, the substrate processing apparatus further includes a facing-member rotating unit that rotates the facing member around the rotational axis.

According to this arrangement, it is possible to scatter liquid droplets adhering to the facing surface in a direction away from the rotational center position by means of a centrifugal force by allowing the facing-member rotating unit to rotate the facing member around the rotational axis. This makes it possible to restrain the liquid droplets adhering to the facing surface from falling onto the front surface of the substrate closer to the rotational center position than to the peripheral edge of the opening. Therefore, the liquid droplets are more reliably restrained from remaining on the substrate.

In one preferred embodiment of the present invention, the substrate processing apparatus further includes a substrate heating unit that heats the substrate held by the substrate holding unit. The controller is programmed to control the substrate heating unit and cause the substrate heating unit to heat a substrate at least during a period of time during which a low-surface-tension liquid is supplied from the low-surface-tension liquid supply unit to the front surface of the substrate.

According to this arrangement, the evaporation of a low-surface-tension liquid at the peripheral edge of the opening is accelerated by heating the substrate, and, as a result, it is possible to improve a speed at which the opening is enlarged. This makes it possible to dry the front surface of the substrate even more swiftly. Therefore, it is possible to further shorten a period of time during which surface tension caused by a low-surface-tension liquid or by processing liquid that has merged into the low-surface-tension liquid acts.

One preferred embodiment of the present invention provides a substrate processing method including a processing-liquid supply step of supplying a processing liquid including water to a substrate held horizontally, a replacing step of replacing the processing liquid by supplying a low-surface-tension liquid that has surface tension lower than water to the substrate, a liquid-film forming step of forming a liquid film of a low-surface-tension liquid having surface tension lower than water on a front surface of the substrate by supplying the low-surface-tension liquid to the substrate, an opening forming step of forming an opening that spreads from a rotational center position in the liquid film of a low-surface-tension liquid by supplying an inert gas toward the rotational center position that is a position existing on a predetermined rotational axis of the front surface of the substrate while rotating the substrate around the rotational axis that extends in a vertical direction, an opening enlarging step of enlarging the opening in a direction away from the rotational center position by supplying an inert gas toward the rotational center position, and a landing-position changing step of supplying a low-surface-tension liquid that has surface tension lower than water to the front surface of the substrate so that a landing position present on the front surface of the substrate on which the liquid lands is placed outside a peripheral edge of the opening and changing the landing position to at least two positions except the rotational center position in accordance with enlargement of the opening.

According to this method, when the opening is enlarged in a direction away from the rotational center position, an inert gas is supplied toward the rotational center position. Therefore, it is possible to evenly expand the opening from the rotational center position while quickly drying a low-surface-tension liquid at the peripheral edge of the opening. Additionally, the landing position is changed to at least two positions in accordance with the enlargement of the opening so that the landing position of the low-surface-tension liquid is placed outside the peripheral edge of the opening. Thereby, the low-surface-tension liquid is satisfactorily supplied to an area outside the peripheral edge of the opening. Therefore, the low-surface-tension liquid outside the peripheral edge of the opening is restrained from locally disappearing from on the front surface of the substrate because of evaporation or a centrifugal force. Therefore, the liquid film is excluded outwardly from the substrate while restraining or preventing the liquid film from being torn, and therefore a low-surface-tension liquid or processing liquid that has merged into the low-surface-tension liquid is restrained or prevented from remaining on the substrate in the form of liquid droplets. Thus, it is possible to swiftly dry the front surface of the substrate while restraining a low-surface-tension liquid and the like from remaining on the front surface of the substrate. This makes it possible to shorten a period of time during which surface tension caused by the low-surface-tension liquid or by processing liquid that has merged thereinto acts.

In one preferred embodiment of the present invention, the landing-position changing step includes a step of moving the landing position so that a distance between the peripheral edge of the opening and the landing position is kept constant. According to this method, in a process in which the opening is enlarged, the distance between the peripheral edge of the opening and the landing position is kept constant. Therefore, the liquid film of the low-surface-tension liquid that has become annular by the formation of the opening is more reliably restrained or prevented from being locally dried and being torn.

In one preferred embodiment of the present invention, the landing-position changing step includes a step of moving a nozzle that supplies a low-surface-tension liquid toward the front surface of the substrate in a direction along the front surface of the substrate. According to this method, it is possible to arbitrarily set and change the landing position by moving the nozzle. It is possible to change the landing position in a non-stepwise manner if the nozzle is moved in a non-stepwise manner. This makes it possible to cause the landing position to faithfully follow the enlargement of the opening of the liquid film.

In one preferred embodiment of the present invention, at least the replacing step, the liquid-film forming step, and the landing-position changing step include a step of heating the substrate. According to this method, the substrate is heated, and, as a result, it is possible to improve a speed at which the opening is enlarged while accelerating the evaporation of a low-surface-tension liquid at the peripheral edge of the opening. This makes it possible to dry the front surface of the substrate even more swiftly. Thereby, it is possible to further shorten a period of time during which surface tension caused by a low-surface-tension liquid or by processing liquid that has merged thereinto acts.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a schematic sectional view to describe an arrangement example of a processing unit included in a substrate processing apparatus according to a third preferred embodiment of the present invention.

DETAILED DESCRIPTION OF THE PREFERRED EMBODIMENTS

First Preferred Embodiment

Figure 1:
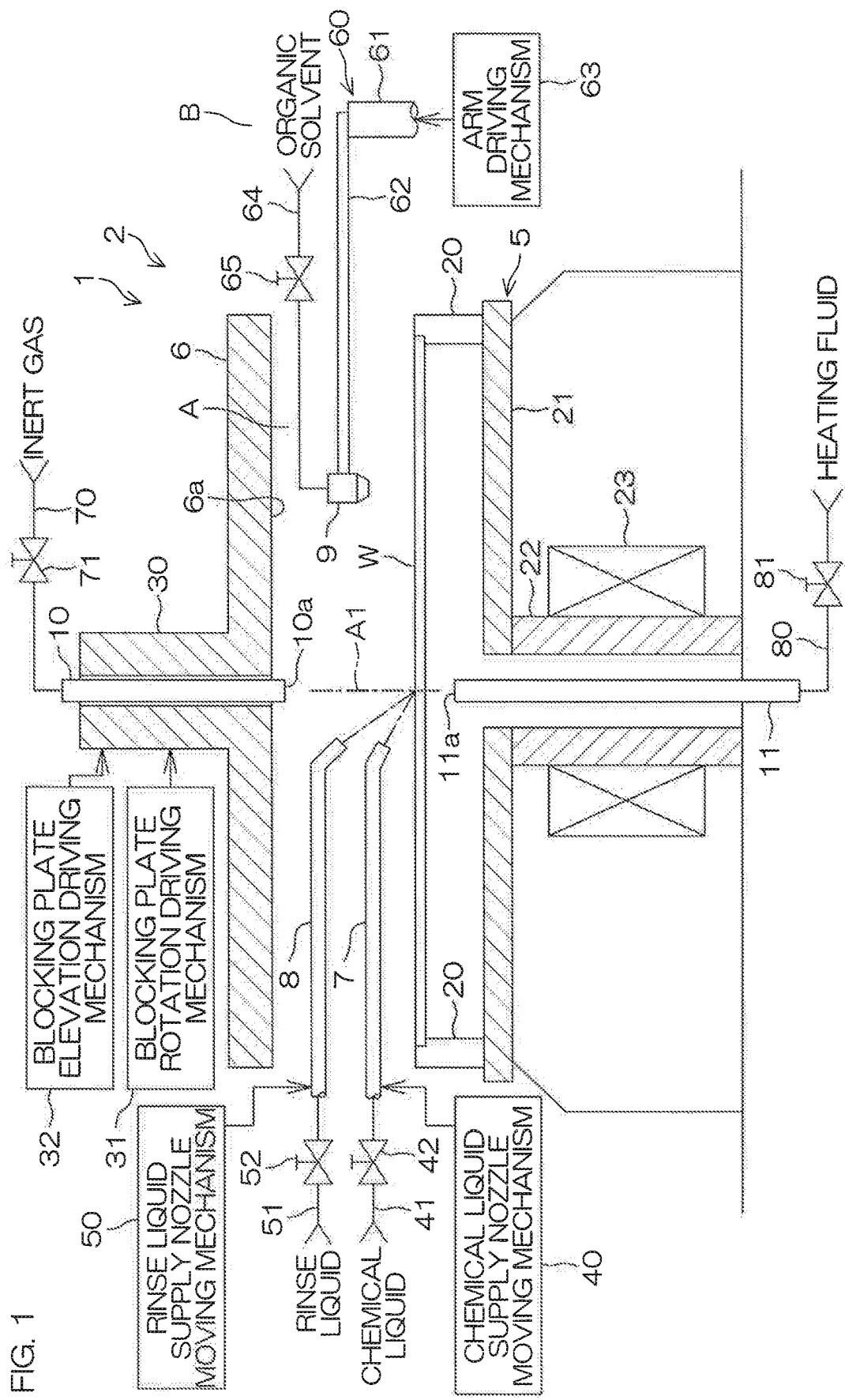
FIG. 1 is a schematic sectional view to describe an arrangement example of a processing unit included in a substrate processing apparatus according to a first preferred embodiment of the present invention.
Figure 14:
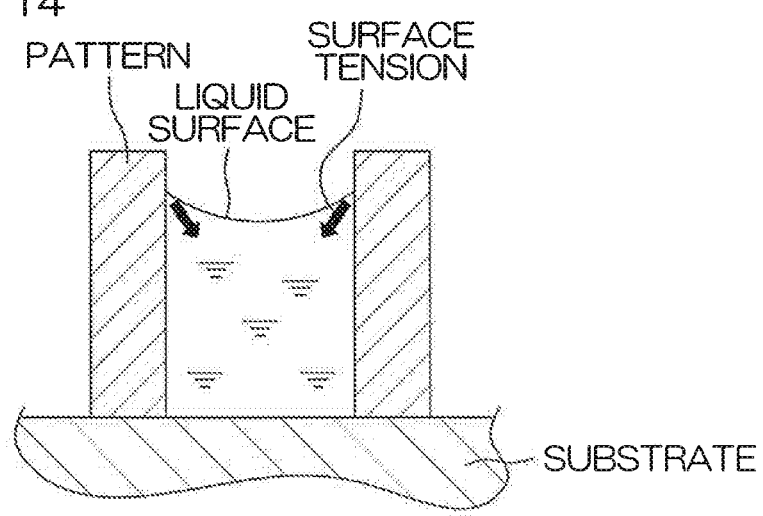
FIG. 14 is a schematic sectional view to describe the principle of a pattern collapse caused by surface tension.

FIG. 1 is a schematic sectional view to describe an arrangement example of a processing unit included in a substrate processing apparatus 1 according to a first preferred embodiment of the present invention. The substrate processing apparatus 1 is a single substrate processing type apparatus that processes substrates W, such as silicon wafers, one by one. In this preferred embodiment, the substrate W is a circular substrate. A fine pattern (see FIG. 14) is formed on the front surface of the substrate W. The substrate processing apparatus 1 includes a processing unit 2 that processes a substrate W by use of a liquid. The substrate processing apparatus 1 may include a transfer robot that carries a substrate W into or out of the processing unit 2, in addition to the processing unit 2. The substrate processing apparatus 1 may include a plurality of processing units 2.

The processing unit 2 includes a spin chuck 5 that rotates a substrate W around a vertical rotational axis A1 passing through the center of the substrate W while holding the single substrate W in a horizontal posture, and a blocking plate 6 that blocks (isolates) a space A between the substrate W and the blocking plate 6 from a circumambient atmosphere B and that serves as a facing member that faces the substrate W. The processing unit 2 additionally includes a chemical liquid supply nozzle 7 that supplies a chemical liquid, such as hydrofluoric acid, to the front surface (upperside principal plane) of the substrate W held by the spin chuck 5 and a rinse liquid supply nozzle 8 that supplies a rinse liquid to the front surface of the substrate W held by the spin chuck 5. The rinse liquid supply nozzle 8 is included in a processing liquid supply unit that supplies a processing liquid that includes water.

The spin chuck 5 includes a chuck pin 20, a spin base 21, a rotational shaft 22, and a substrate rotation driving mechanism 23 that rotates a substrate W around the rotational axis A1. The chuck pin 20 and the spin base 21 are included in a substrate holding unit that horizontally holds a substrate W. The rotational shaft 22 and the substrate rotation driving mechanism 23 are included in a substrate rotating unit that rotates a substrate W around the rotational axis A1.

The rotational shaft 22 extends in a vertical direction along the rotational axis A1. The rotational shaft 22 is a hollow shaft in the present preferred embodiment. The upper end of the rotational shaft 22 is joined to the center of the lower surface of the spin base 21. The spin base 21 has a disk shape along a horizontal direction. A plurality of chuck pins 20 that grasp a substrate W are spaced out in a circumferential direction at the peripheral edge of the upper surface of the spin base 21. The substrate rotation driving mechanism 23 includes an electric motor that rotates the substrate W, the chuck pin 20, the spin base 21, and the rotational shaft 22 together around the rotational axis A1, for example, by applying a rotational force to the rotational shaft 22.

The blocking plate 6 is formed in a disk shape that has a diameter substantially equal to or larger than the substrate W, and is substantially horizontally disposed above the spin chuck 5. The blocking plate 6 has a facing surface 6a that faces a substrate W held by the spin chuck 5. A rotational shaft 30 is fixed to a surface opposite to the facing surface 6a of the blocking plate 6. The rotational shaft 30 has the common rotational axis A1 with the rotational shaft 22. The rotational shaft 30 is formed in a hollow shape.

A blocking-plate-rotation driving mechanism 31 that rotates the blocking plate 6 around the rotational axis A1 by applying a rotational force to the rotational shaft 30 is joined to the rotational shaft 30. The blocking-plate-rotation driving mechanism 31 is included in a facing-member rotating unit. The blocking-plate-rotation driving mechanism 31 is, for example, a motor that applies a rotational force to the rotational shaft 30. A blocking-plate-elevation driving mechanism 32 is joined to the rotational shaft 30. The blocking-plate-elevation driving mechanism 32 raises and lowers the blocking plate 6 fixed to the rotational shaft 30 by raising and lowering the rotational shaft 30 in the vertical direction. The blocking-plate-elevation driving mechanism 32 is capable of placing the blocking plate 6 at an arbitrary position (height) from a lower position to an upper position. The lower position is, for example, a position at which the facing surface 6a is placed 0.5 mm to 2.5 mm above the front surface of the substrate W. The upper position is, for example, a position at which the facing surface 6a is placed 150 mm above the front surface of the substrate W. When the blocking plate 6 is placed at a position at which the blocking plate 6 sufficiently approaches the front surface of the substrate W, the space A between the facing surface 6a and the front surface of the substrate W is isolated from the atmosphere B of surroundings (outside the space A between the facing surface 6a and the front surface of the substrate W) by means of the blocking plate 6.

The chemical liquid supply nozzle 7 is moved in, for example, the horizontal direction (i.e., direction perpendicular to the rotational axis A1) by means of a chemical-liquid-supply-nozzle moving mechanism 40. The chemical liquid supply nozzle 7 moves in accordance with the movement in the horizontal direction between a central position that faces a rotational center position of the front surface of the substrate W and a retreat position that does not face the front surface of the substrate W. The rotational center position of the front surface of the substrate W is an intersection with the rotational axis A1 in the front surface of the substrate W. The retreat position that does not face the front surface of the substrate W is a position placed outside the spin base 21 in a plan view. A chemical liquid supply pipe 41 is joined to the chemical liquid supply nozzle 7. A chemical liquid valve 42 that opens and closes the flow passage of the chemical liquid supply pipe 41 is interposed in the chemical liquid supply pipe 41.

A chemical liquid that is supplied to the chemical liquid supply nozzle 7 is not limited to hydrofluoric acid, and may be a liquid including at least one among sulfuric acid, acetic acid, nitric acid, hydrochloric acid, hydrofluoric acid, aqueous ammonia, hydrogen peroxide water, organic acid (for example, citric acid or oxalic acid), organic alkali (for example, TMAH: tetramethylammonium hydroxide), surfactant, and corrosion inhibitor.

The rinse liquid supply nozzle 8 is moved by a rinse-liquid-supply-nozzle moving mechanism 50 in, for example, the horizontal direction (i.e., direction perpendicular to the rotational axis A1). The rinse liquid supply nozzle 8 moves between a central position that faces the rotational center position of the front surface of the substrate W and a retreat position that does not face the front surface of the substrate W in accordance with the movement in the horizontal direction. A rinse liquid supply pipe 51 is joined to the rinse liquid supply nozzle 8. A rinse liquid valve 52 that opens and closes the flow passage of the rinse liquid supply pipe 51 is interposed in the rinse liquid supply pipe 51.

A rinse liquid that is supplied to the rinse liquid supply nozzle 8 is, for example, deionized water (DIW). However, the rinse liquid is not limited to deionized water, and may be any one of soda water, electrolyzed ion water, hydrogenated water, ozonized water, and hydrochloric acid water having a diluted concentration (e.g., about 10 ppm to 100 ppm).

The processing unit 2 additionally includes an organic solvent supply nozzle 9 that supplies an organic solvent that is one example of a low-surface-tension liquid whose surface tension is lower than water to the front surface of the substrate W held by the spin chuck 5, an inert gas supply nozzle 10 that supplies an inert gas, such as a nitrogen gas (N$_2$), toward the rotational center position, and a fluid supply nozzle 11 to heat the substrate W held by the spin chuck 5. The organic solvent supply nozzle 9 is included in a low-surface-tension liquid supply unit that supplies a low-surface-tension liquid to the front surface of the substrate W. The inert gas supply nozzle 10 is included in an inert gas supply unit that supplies an inert gas. The fluid supply nozzle 11 is included in a substrate heating unit that heats a substrate W.

IPA is mentioned as an example of the organic solvent. The low-surface-tension liquid is not limited to IPA, and organic solvents other than IPA, each of which has smaller surface tension than water and each of which does not chemically react upon the front surface of the substrate W and upon a pattern formed on the substrate W (see FIG. 14), may be used as the low-surface-tension liquid. In detail, a liquid including at least one among IPA, HFE (hydrofluoroether), methanol, ethanol, acetone, and trans-1, 2-dichloroethylene may be used as the low-surface-tension liquid. The low-surface-tension liquid is not necessarily required to be made only of a mono-component, and may be a liquid mixed with other components. For example, the low-surface-tension liquid may be a mixed liquid of an IPA solution and pure water, or may be a mixed liquid of an IPA solution and an HFE liquid.

The inert gas is not limited to a nitrogen gas, and is merely required to be an inert gas with respect to the front surface of the substrate W and with respect to the pattern. The inert gas may be rare gasses such as argon.

The organic solvent supply nozzle 9 is moved in the horizontal direction and in the vertical direction by means of an organic-solvent-supply-nozzle moving mechanism 60. The organic solvent supply nozzle 9 moves between the central position that faces the rotational center position of the front surface of the substrate W and the retreat position that does not face the front surface of the substrate W in accordance with the movement in the horizontal direction. The organic solvent supply nozzle 9 approaches the front surface of the substrate W or recedes upwardly from the front surface of the substrate W in accordance with the movement in the vertical direction.

Figure 2:
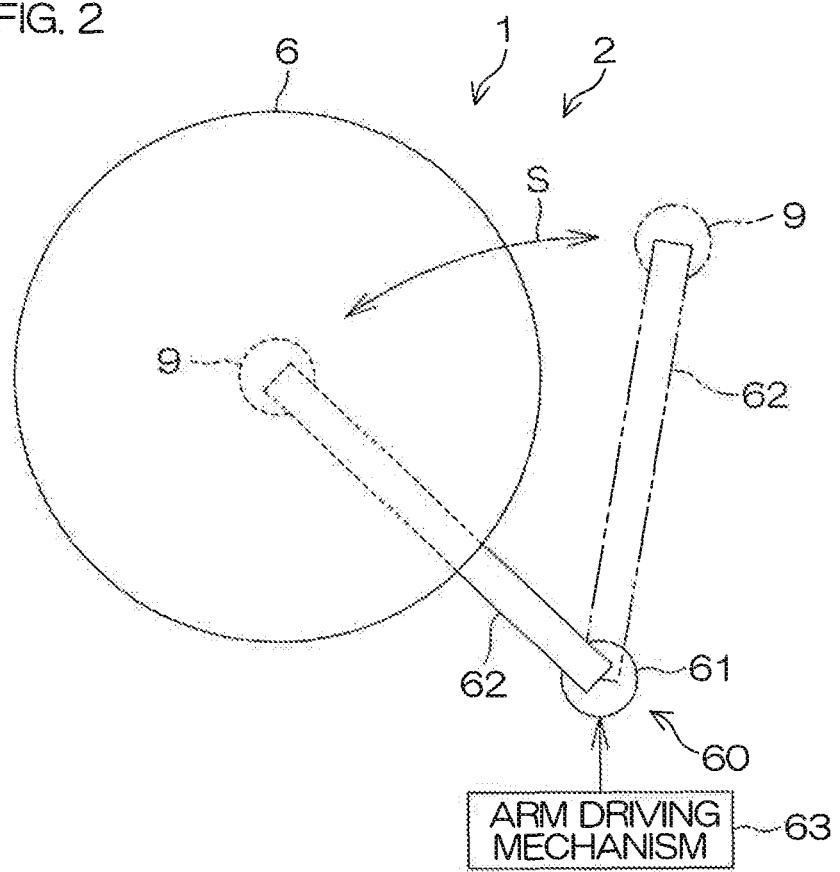
FIG. 2 is a schematic plan view of the processing unit according to the first preferred embodiment.

The organic solvent supply nozzle moving mechanism 60 includes, for example, a turning shaft 61 along the vertical direction, an arm 62 that is joined to the turning shaft 61 and that extends horizontally, and an arm driving mechanism 63 that moves the organic solvent supply nozzle 9 in a direction along the front surface of the substrate W (i.e., turning direction S around the central axis of the turning shaft 61) while driving the arm 62. The arm driving mechanism 63 is included in a nozzle moving unit. The arm driving mechanism 63 includes an air cylinder that raises and lowers the organic solvent supply nozzle 9 by moving the turning shaft 61 upwardly and downwardly in the vertical direction. The arm driving mechanism 63 includes a motor that applies a turning force in the turning direction S to the turning shaft 61. As shown in FIG. 2 that is a schematic plan view of the processing unit 2, the arm driving mechanism 63 causes the arm 62 to turn in the turning direction S around the central axis of the turning shaft 61, so that the organic solvent supply nozzle 9 moves between the retreat position and the central position.

An organic solvent supply pipe 64 is joined to the organic solvent supply nozzle 9. An organic solvent valve 65 that opens and closes the flow passage of the organic solvent supply pipe 64 is interposed in the organic solvent supply pipe 64.

The inert gas supply nozzle 10 is inserted through the hollow rotational shaft 30 joined to the blocking plate 6. The inert gas supply nozzle 10 has its lower end having a discharge port 10a that faces the center of the front surface of the substrate W. The inert gas supply nozzle 10 is disposed so as to be movable in the vertical direction together with the blocking plate 6 and so as to be unmovable in the horizontal direction. The inert gas supply nozzle 10 may be connected to the rotational shaft 30 through, for example, a bearing (not shown).

An inert gas supply pipe 70 is joined to the inert gas supply nozzle 10. An inert gas valve 71 that opens and closes the flow passage of the inert gas supply pipe 70 is interposed in the inert gas supply pipe 70.

The fluid supply nozzle 11 heats the substrate W by supplying a heating fluid toward the rear surface (lower-side principal plane) of the substrate W. The fluid supply nozzle 11 is inserted through the rotational shaft 22. The fluid supply nozzle 11 has its upper end having a discharge port 11a that faces a central area including the rotational center position of the rear surface of the substrate W. The rotational center position of the rear surface of the substrate W is an intersection with the rotational axis A1 in the rear surface of the substrate W. A heating fluid is supplied from a fluid supply source to the fluid supply nozzle 11 through a fluid supply pipe 80. The heating fluid that is supplied to the fluid supply nozzle 11 is, for example, warm water (water higher in temperature than room temperature and lower in temperature than the boiling point of an organic solvent). The heating fluid that is supplied to the fluid supply nozzle 11 is not limited to warm water, and may be a gas, such as a high-temperature nitrogen gas, and is merely required to be a fluid capable of heating the substrate W. A fluid valve 81 that opens and closes the flow passage of the fluid supply pipe 80 is interposed in the fluid supply pipe 80.

Figure 3:
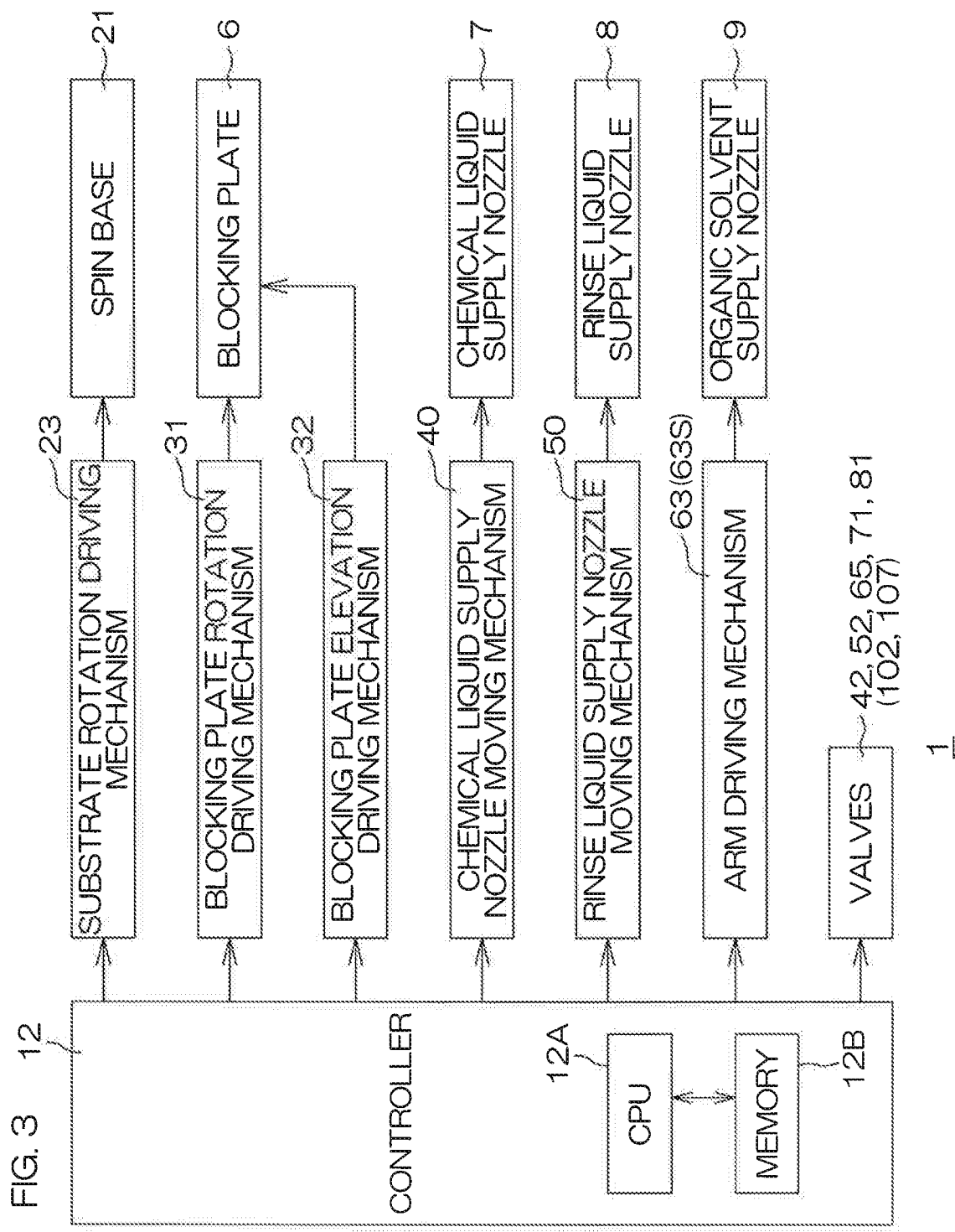
FIG. 3 is a block diagram to describe an electric configuration of a main part of the substrate processing apparatus.

FIG. 3 is a block diagram to describe an electric configuration of a main part of the substrate processing apparatus 1. The substrate processing apparatus 1 includes a controller 12. The controller 12 includes a microcomputer, and controls to-be-controlled components included in the substrate processing apparatus 1 in accordance with a predetermined control program. The controller 12 includes a processor (CPU) 12A and a memory 12B in which the control program is stored. The controller 12 is arranged to perform various control operations for substrate processing by causing the processor 12A to perform the control program. Particularly, the controller 12 is programmed to control the substrate rotation driving mechanism 23, the blocking-plate-rotation driving mechanism 31, the blocking-plate-elevation driving mechanism 32, the chemical-liquid-supply-nozzle moving mechanism 40, the rinse-liquid-supply-nozzle moving mechanism 50, the arm driving mechanism 63, and the valves 42, 52, 65, 71, 81.

Figure 4:
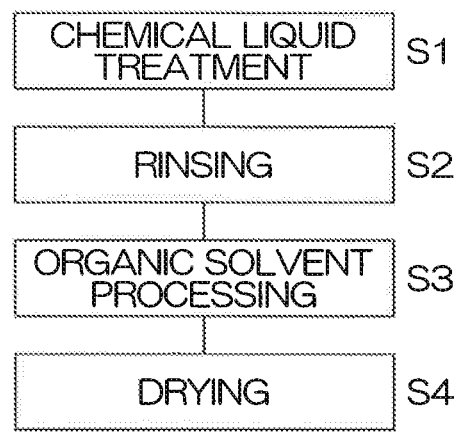
FIG. 4 is a flowchart to describe an example of substrate processing performed by the processing unit.
Figure 5:
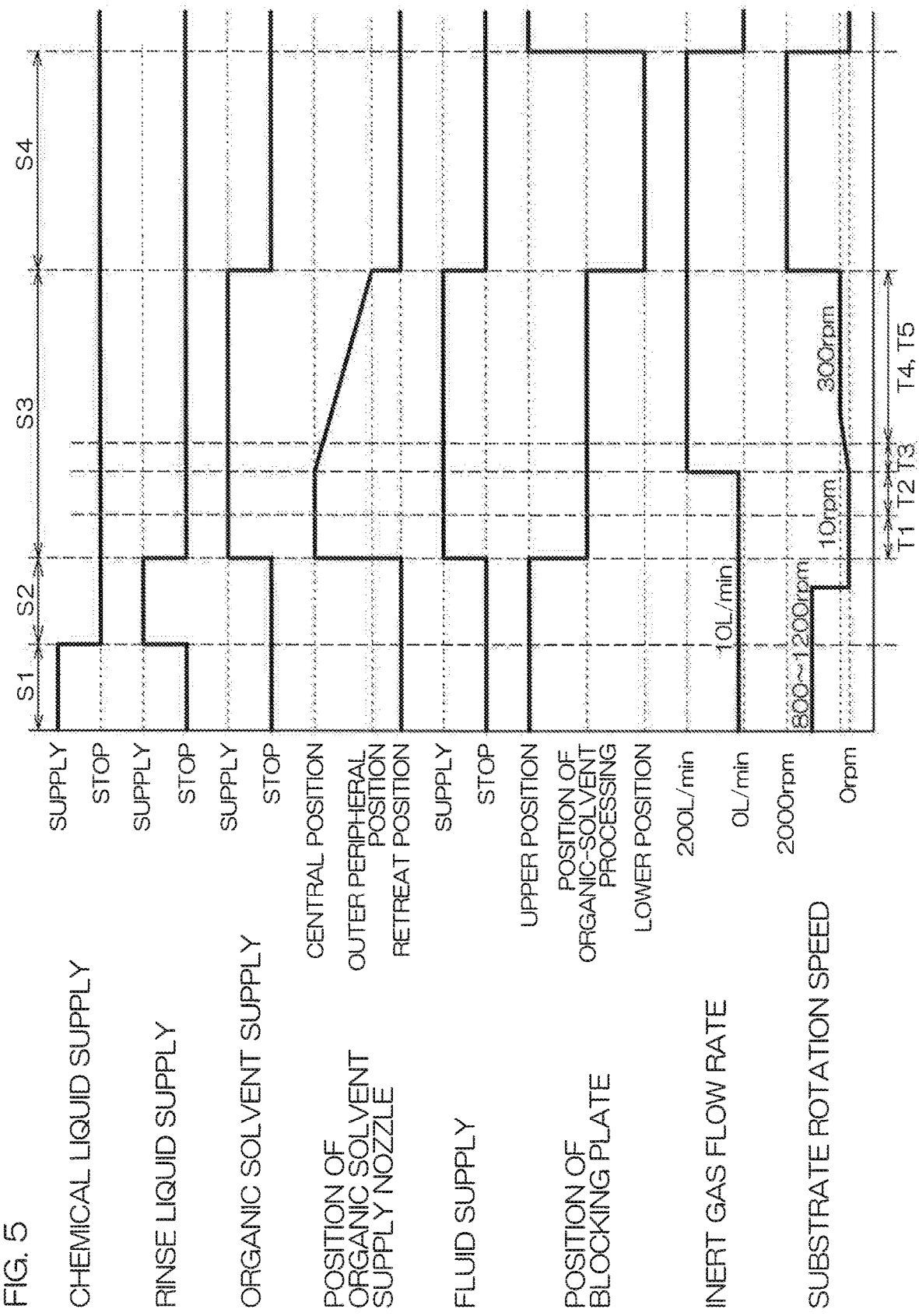
FIG. 5 is a time chart to describe an example of substrate processing performed by the processing unit.

FIG. 4 is a flowchart to describe an example of substrate processing performed by the processing unit 2. FIG. 5 is a time chart to describe an example of substrate processing performed by the processing unit 2. In FIG. 5, the term "fluid supply" is an item showing a discharge status of warm water discharged from the fluid supply nozzle 11. In the substrate processing performed by the processing unit 2, a chemical-liquid treatment step is first performed (step S1). First, an inert gas starts to be supplied in the chemical-liquid treatment step. In detail, the controller 12 opens the inert gas valve 71, and causes the inert gas supply nozzle 10 to supply an inert gas in a state in which the substrate W is held by the spin chuck 5. The flow rate of the inert gas at this time is, for example, 10 liter/min.

The spin base 21 is rotated by allowing the controller 12 to drive the substrate rotation driving mechanism 23. Thereby, the substrate W starts to be rotated. In the chemical-liquid treatment step, the spin base 21 is rotated at a predetermined chemical-liquid rotation speed. The chemical liquid rotation speed is, for example, 800 rpm to 1000 rpm. The controller 12 rotates the blocking plate 6 at a predetermined blocking-plate rotation speed by driving the blocking-plate-rotation driving mechanism 31. The blocking plate 6 may be rotated in the same direction as the rotational direction of the substrate W at the same speed as the substrate W. The controller 12 places the blocking plate 6 at an upper position by driving the blocking-plate-elevation driving mechanism 32.

The controller 12 controls the chemical-liquid-supply-nozzle moving mechanism 40, and places the chemical liquid supply nozzle 7 at a chemical-liquid treatment position above the substrate W. The chemical-liquid treatment position may be a position at which a chemical liquid discharged from the chemical liquid supply nozzle 7 can land on the rotational center position of the front surface of the substrate W. The controller 12 opens the chemical liquid valve 42. As a result, a chemical liquid is supplied from the chemical liquid supply nozzle 7 toward the front surface of the substrate W being rotating. The chemical liquid supplied thereto spreads over the entire front surface of the substrate W by means of a centrifugal force. After chemical liquid treatment is performed for a fixed period of time, the controller 12 closes the chemical liquid valve 42, and then controls the chemical-liquid-supply-nozzle moving mechanism 40, and, as a result, the chemical liquid supply nozzle 7 is moved from the chemical-liquid treatment position to the retreat position. Thereby, the chemical-liquid treatment step ends.

Thereafter, a rinsing step in which a chemical liquid is excluded from on the front surface of the substrate W by replacing the chemical liquid present on the front surface of the substrate W with a rinse liquid is performed (step S2). In detail, the rinse liquid supply nozzle 8 is placed at a rinse-liquid processing position above the substrate W by allowing the controller 12 to control the rinse-liquid-supply-nozzle moving mechanism 50. The rinse-liquid processing position may be a position at which a rinse liquid discharged from the rinse liquid supply nozzle 8 lands on the rotational center position of the front surface of the substrate W. The controller 12 causes the rinse liquid supply nozzle 8 to supply a processing liquid, such as a rinse liquid, to the front surface of the substrate W being rotating by opening the rinse liquid valve 52 (processing-liquid supply step). The rinse liquid supplied thereto spreads over the entire front surface of the substrate W by means of a centrifugal force, and replaces the chemical liquid therewith. In the rinsing step, the spin base 21 is rotated at a predetermined rinse-liquid rotation speed by allowing the controller 12 to control the substrate rotation driving mechanism 23. The rinse liquid rotation speed is, for example, 800 rpm to 1200 rpm.

Thereafter, the rinse liquid continues to be supplied to the front surface of the substrate W, and, as a result, a liquid film of the rinse liquid is formed on the front surface of the substrate W. The spin base 21 is rotated at a predetermined rinse-liquid-film forming speed by allowing the controller 12 to control the substrate rotation driving mechanism 23. The rinse-liquid-film forming speed is, for example, 10 rpm. When the liquid film of the rinse liquid is formed on the front surface of the substrate W, the controller 12 closes the rinse liquid valve 52, and then controls the rinse-liquid-supply-nozzle moving mechanism 50, and, as a result, moves the rinse liquid supply nozzle 8 from the rinse liquid processing position to the retreat position. Thereby, the rinsing step ends.

Thereafter, an organic-solvent processing step in which the substrate W is processed by an organic solvent that is a low-surface-tension liquid lower in surface tension than the rinse liquid is performed (step S3). In the organic-solvent processing step, a substrate heating step is performed in parallel. In the substrate heating step, the controller 12 opens the fluid valve 81. Therefore, a heating fluid (for example, warm water) is supplied from the fluid supply nozzle 11 to a central area including the rotational center position of the rear surface of the substrate W being rotating. The heating fluid supplied thereto spreads over the entire rear surface of the substrate W by means of a centrifugal force. As a result, the entire substrate W is heated.

In, the organic-solvent processing step, the blocking plate 6 is placed at an organic-solvent processing position between the upper position and the lower position by allowing the controller 12 to drive the blocking-plate-elevation driving mechanism 32. The organic-solvent processing position is a position at which the facing surface 6a is placed, for example, 15 mm above the front surface of the substrate W. It is possible for the blocking plate 6 present at this organic-solvent processing position to isolate the space A between the facing surface 6a and the front surface of the substrate W from the outer atmosphere B.

Figure 6A:
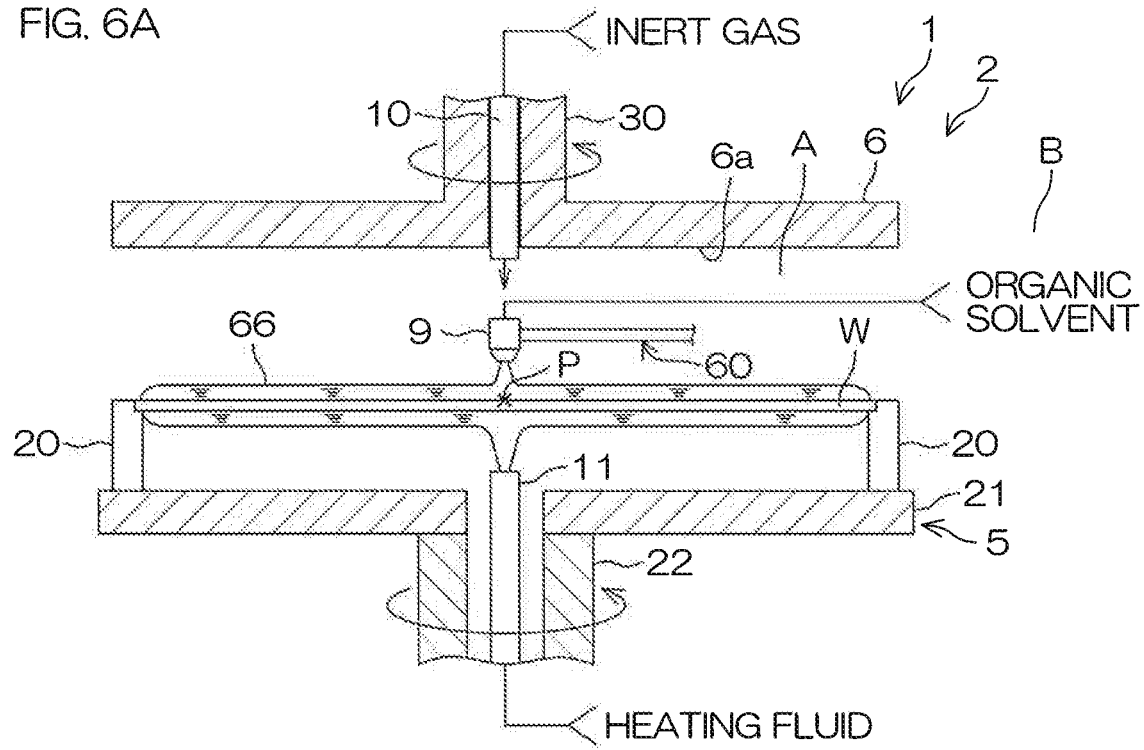
FIG. 6A is a schematic sectional view to describe a situation in which the processing unit processes a substrate by use of an organic solvent.
Figure 6B:
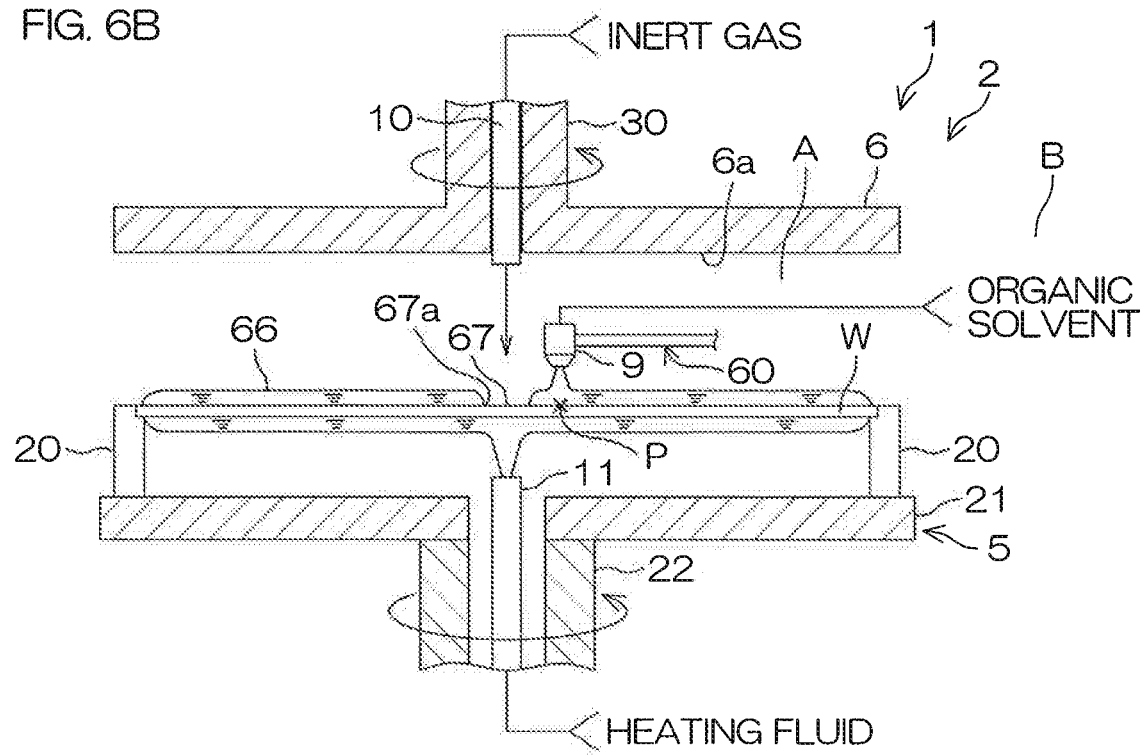
FIG. 6B is a schematic sectional view to describe a situation in which the processing unit processes a substrate by use of an organic solvent.
Figure 6C:
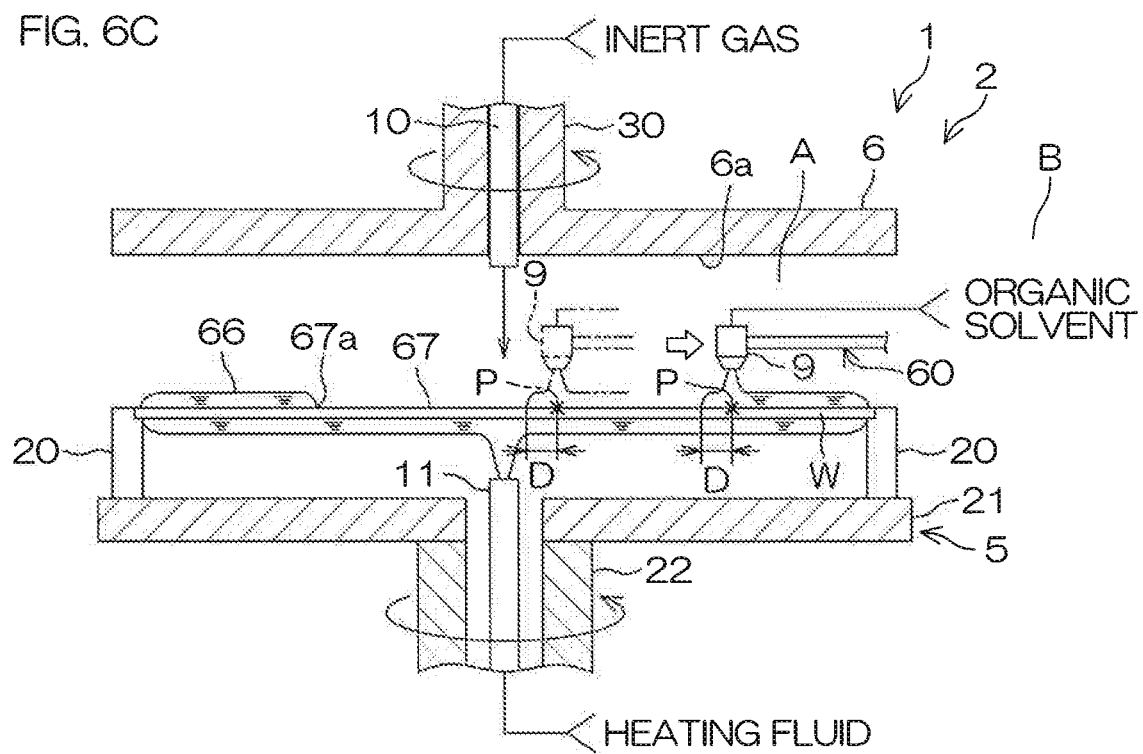
FIG. 6C is a schematic sectional view to describe a situation in which the processing unit processes a substrate by use of an organic solvent.

Next, the organic-solvent processing step will be described in more detail with reference to FIG. 6A to FIG. 6C. FIG. 6A to FIG. 6C are schematic sectional views to describe a situation in which the processing unit 2 according to the first preferred embodiment processes a substrate W by use of an organic solvent. FIG. 6A corresponds to a replacing step T1 and a liquid-film forming step T2 described later. FIG. 6B corresponds to an opening forming step T3 described later. FIG. 6C corresponds to an opening enlarging step T4 and a landing-position changing step T5 described later.

The organic solvent supply nozzle 9 is moved from the retreat position to the organic solvent supply position above the substrate W by allowing the controller 12 to control the organic-solvent-supply-nozzle moving mechanism 60. The organic solvent supply position is a position at which an organic solvent discharged from the organic solvent supply nozzle 9 lands on the rotational center position of the substrate W. The organic solvent supply position may coincide with the central position in the same way as in the present preferred embodiment. When the organic solvent supply nozzle 9 moves to the organic solvent supply position, the controller 12 opens the organic solvent valve 65. As a result, as shown in FIG. 6A, an organic solvent is supplied from the organic solvent supply nozzle 9 toward the front surface of the substrate W being rotating.

The organic solvent is supplied to the front surface of the substrate W being rotating, and, as a result, the organic solvent supplied thereto spreads over the entire front surface of the substrate W by means of a centrifugal force. Thereby, the rinse liquid present on the front surface of the substrate W is replaced with the organic solvent (replacing step T1). The controller 12 controls the substrate rotation driving mechanism 23 so that the spin base 21 rotates at a predetermined replacing speed. The replacing speed is, for example, 10 rpm. The replacing speed may be about 300 rpm.

When the rinse liquid present on the front surface of the substrate W is completely replaced with the organic solvent, the controller 12 controls the substrate rotation driving mechanism 23 so that the spin base 21 rotates at a predetermined organic-solvent-liquid-film forming speed. The organic-solvent-liquid-film forming speed is, for example, 10 rpm. The rotation speed of the substrate W is low, and therefore the organic solvent supplied to the front surface of the substrate W does not fall off from the substrate W by means of the centrifugal force, and gathers on the front surface of the substrate W because of surface tension. In this way, a liquid film 66 of the organic solvent is formed on the front surface of the substrate W (liquid-film forming step T2).

Figure 7A:
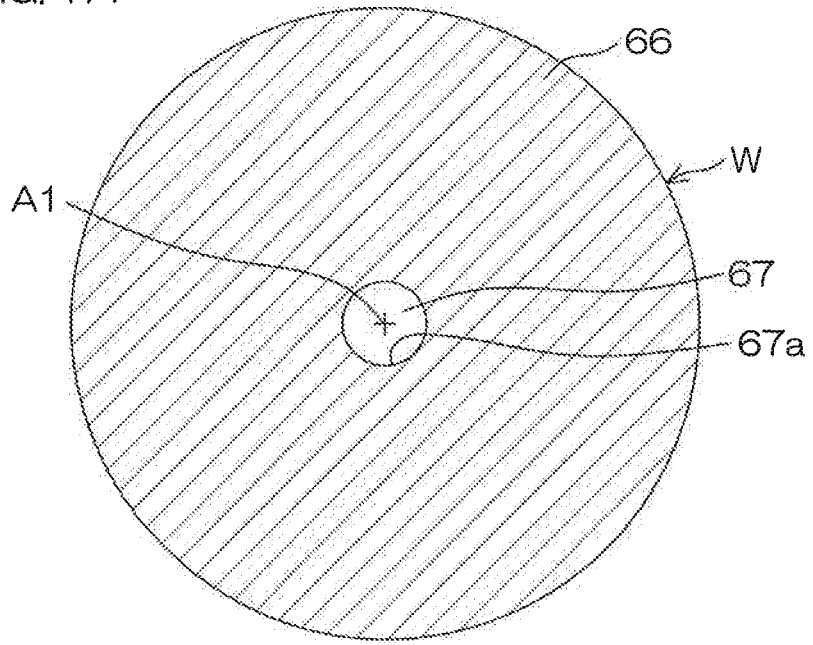
FIG. 7A is a plan view showing a state of a liquid film in an opening forming step.

Thereafter, the opening forming step T3 of forming an opening 67 in the liquid film 66 of the organic solvent is started. When the process enters the opening forming step T3, the controller 12 controls the arm driving mechanism 63 in order to move the organic solvent supply nozzle 9 from the organic solvent supply position (for example, central position). The organic solvent supply nozzle 9 continues to supply an organic solvent. At the same time as the organic solvent supply nozzle 9 moves from the central position, the controller 12 increases the flow rate of an inert gas to a predetermined liquid-film-excluding flow rate by adjusting the inert gas valve 71. The liquid-film-excluding flow rate is, for example, 200 liter/min. When the organic solvent supply nozzle 9 moves from the organic solvent supply position, the organic solvent stops to be supplied to the liquid film 66 at the rotational center position of the substrate W. In this state, a large flow of inert gas is sprayed onto the liquid film 66 at the rotational center position of the front surface of the substrate W being rotating, and, as a result, the opening 67 that circularly spreads at the rotational center position of the substrate W is formed in the liquid film 66 as shown in FIG. 6B and FIG. 7A. FIG. 7A is a plan view showing a state of the liquid film in the opening forming step T3. For clarity, oblique lines are drawn on the liquid film 66 of the organic solvent in FIG. 7A (and FIG. 7B described later).

Figure 7B:
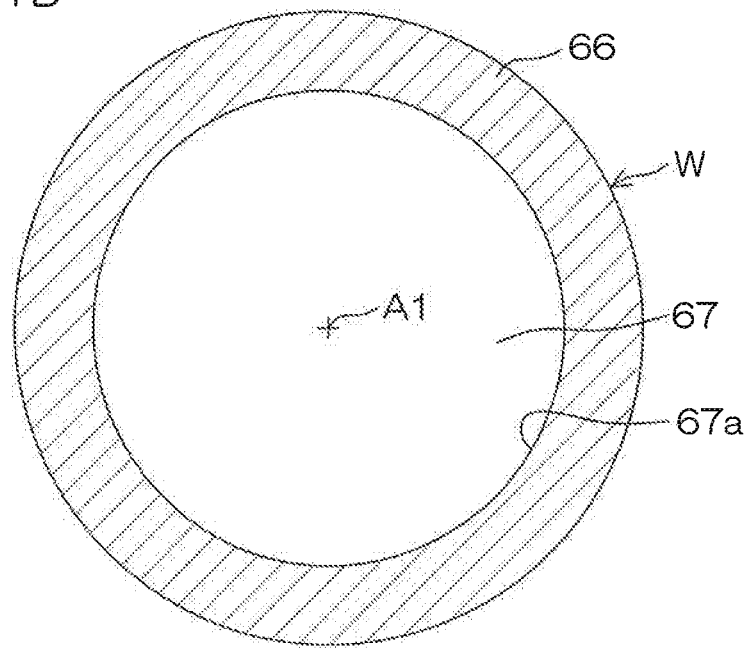
FIG. 7B is a plan view showing a state of a liquid film in an opening enlarging step.

The inert gas further continues to be supplied, so that the spraying force of the inert gas acts radially from the rotational center. As a result, the opening 67 is enlarged in a direction away from the rotational center position as shown in FIG. 7B (opening enlarging step T4). FIG. 7B is a plan view showing a state of the liquid film 66 in the opening enlarging step T4.

The rotation of the spin base 21 is gradually accelerated by allowing the controller 12 to control the substrate rotation driving mechanism 23 in the opening forming step T3 and the opening enlarging step T4. The rotation of the spin base 21 is accelerated until its speed reaches 300 rpm, and is then maintained at the speed of 300 rpm for a fixed period of time.

The landing-position changing step T5 is performed in which the landing position P is changed in accordance with the enlargement of the opening 67 so that the landing position P is placed outside the peripheral edge 67a of the opening 67. The term "outside the peripheral edge 67a of the opening 67" denotes "on the side opposite to the rotational center position with respect to the peripheral edge 67a." Additionally, the landing position P denotes a position at which an organic solvent supplied from the organic solvent supply nozzle 9 lands on the front surface of the substrate W.

As shown in FIG. 6C, in the landing-position changing step T5, the organic solvent supply nozzle 9 is moved in the turning direction S (see FIG. 2) that is a direction along the front surface of the substrate W by allowing the controller 12 to control the arm driving mechanism 63 of the organic-solvent-supply-nozzle moving mechanism 60. As a result, the landing position P of the organic solvent on the front surface of the substrate W is changed (nozzle moving step). As thus described, the arm driving mechanism 63 is included in a landing-position changing unit. Preferably, at this time, the arm driving mechanism 63 continuously moves the organic solvent supply nozzle 9 in a predetermined area in accordance with the enlargement of the opening 67 so that a distance D between the peripheral edge 67a of the opening 67 and the landing position P is kept constant. The predetermined area may be an area ranging from the central position to a slightly inner position (outer peripheral position) than the outer periphery of the substrate W. In this case, the landing position P is changed to a plurality of positions, i.e., to two or more positions except the rotational center position. The arm driving mechanism 63 may stepwise (discontinuously) change the landing position P to at least two positions except the rotational center position in accordance with the enlargement of the opening 67. The opening 67 is enlarged, and the liquid film 66 is excluded from the front surface of the substrate W, and, as a result, the processing of the substrate W by use of the organic solvent is ended.

A heating fluid (for example, warm water) is supplied from the fluid supply nozzle 11 to the rear surface of the substrate W by allowing the controller 12 to open the fluid valve 81 at least during a period of time during which an organic solvent is supplied to the substrate W, i.e., at least in the organic-solvent processing step S3 (the replacing step T1, the liquid-film forming step T2, the opening forming step T3, the opening enlarging step T4, and the landing-position changing step T5). Thereby, the substrate W is heated.

After the processing by use of the organic solvent is finished in this way, the controller 12 controls the substrate rotation driving mechanism 23. Thereby, the substrate W is rapidly rotated at a predetermined dry rotation speed. The dry rotation speed is, for example, 2000 rpm. Thereby, a drying step (step S4) is performed to shake off liquid components present on the substrate W by means of a centrifugal force. In the drying step, the blocking plate 6 is moved to the lower position by allowing the controller 12 to control the blocking-plate-elevation driving mechanism 32. The drying step is also called a spin dry step.

The substrate processing performed by the processing unit 2 is ended through these steps as described above.

According to the first preferred embodiment, when the opening 67 is enlarged in a direction away from the rotational center position, an inert gas is supplied toward the rotational center position. Therefore, it is possible to evenly expand the opening 67 from the rotational center position while quickly drying an organic solvent at the peripheral edge 67a of the opening 67. The landing position P is changed to at least two positions in accordance with the enlargement of the opening 67 so that the landing position P of the organic solvent is placed outside the peripheral edge 67a of the opening 67. Therefore, the organic solvent is satisfactorily supplied to an area outside the peripheral edge 67a of the opening 67. Therefore, the organic solvent outside the peripheral edge 67a of the opening 67 is restrained from locally disappearing because of evaporation or a centrifugal force. Therefore, it is possible to exclude the liquid film 66 of the organic solvent outwardly from the substrate W while restraining or preventing the liquid film 66 of the organic solvent from being torn. Therefore, an organic solvent or moisture that has merged into the organic solvent is restrained or prevented from remaining on the substrate W in the form of liquid droplets. Thus, it is possible to swiftly dry the front surface of the substrate W while restraining an organic solvent and the like from remaining on the front surface of the substrate W. Thereby, a period of time during which surface tension caused by the organic solvent and the like acts on a fine pattern present on the substrate W is shortened, and therefore the pattern is restrained or prevented from being collapsed.

According to the first preferred embodiment, in a process in which the opening 67 is enlarged, the distance D between the peripheral edge 67a of the opening 67 and the landing position P is kept constant. As a result, the liquid film 66 of the organic solvent that has become annular by the formation of the opening 67 is more reliably restrained or prevented from being locally dried and being torn.

According to the first preferred embodiment, the organic-solvent-supply-nozzle moving mechanism 60 moves the organic solvent supply nozzle 9 in a direction along the front surface of the substrate W. Therefore, it is possible to arbitrarily set and change the landing position P. If the organic solvent supply nozzle 9 is moved in a non-stepwise manner, it is possible to change the landing position P in a non-stepwise manner. This makes it possible to allow the landing position P to faithfully follow the movement of the peripheral edge 67a resulting from the enlargement of the opening 67, and hence makes it possible to reliably restrain the liquid film 66 from being torn.

According to the first preferred embodiment, in a process in which the opening 67 is enlarged, the facing surface 6a of the blocking plate 6 is caused to satisfactorily approach the front surface of the substrate W, and the space A therebetween is isolated from the circumambient atmosphere B. Therefore, it is possible to properly control an atmosphere and airflow above the substrate W. The space A between the facing surface 6a of the blocking plate 6 and the front surface of the substrate W is isolated from the circumambient atmosphere B, and therefore it is possible to highly maintain the concentration of an organic solvent in the atmosphere above the liquid film 66. As a result, it is possible to bring the organic solvent into a state in which the organic solvent does not easily evaporate outside the peripheral edge 67a of the opening 67. This makes it possible to further restrain the liquid film 66 from being torn.

According to the first preferred embodiment, it is possible for the blocking-plate-rotation driving mechanism 31 to scatter liquid droplets of as an organic solvent and the like, that have adhered to the facing surface 6a in a direction away from the rotational center position by means of a centrifugal force by rotating the blocking plate 6 around the rotational axis A1. This makes it possible to restrain the liquid droplets that have adhered to the facing surface 6a from falling onto the front surface of the substrate W closer to the rotational center position than to the peripheral edge 67a of the opening 67. Therefore, the liquid droplets are more reliably restrained from remaining on the substrate W.

According to the first preferred embodiment, the evaporation of an organic solvent at the peripheral edge 67a of the opening 67 is accelerated by heating the substrate W with a heating fluid from the fluid supply nozzle 11, and, as a result, it is possible to improve a speed at which the opening 67 is enlarged while accelerating. This makes it possible to dry the front surface of the substrate W even more swiftly. Therefore, it is possible to further shorten a period of time during which surface tension caused by an organic solvent or by moisture that has merged into the organic solvent acts on a pattern present on the substrate W.

According to the first preferred embodiment, the inert gas supply nozzle 10 continues to supply an inert gas toward the rotational center position of the front surface of the substrate W without changing a position at which an inert gas is supplied while the opening 67 is being formed and enlarged. Therefore, it is possible to keep an atmosphere near an area above the rotational center position of the substrate W in a dried state, and it is possible to enlarge a dry area in which an atmosphere reaches a dried state in a direction away from the rotational center position in accordance with the enlargement of the opening 67. On the other hand, the concentration of the organic solvent in the atmosphere above the liquid film 66 is kept higher than the atmosphere above the opening 67 by means of the blocking plate 6. Therefore, the organic solvent of the liquid film 66 near the peripheral edge 67a is liable to evaporate, and the organic solvent of the liquid film 66 outer side than the peripheral edge 67a is difficult to evaporate.

Therefore, in the processing unit 2 of the first preferred embodiment, the division of the liquid film 66 is harder to occur than in the substrate processing apparatus (see United States Patent Application Publication No. 2009/0205684 A1, for example) in which a position at which the inert gas supply nozzle 10 supplies an inert gas is changed in a direction away from the rotational center position in accordance with the enlargement of the opening 67. Moreover, the inert gas supply nozzle 10 supplies an inert gas toward the rotational center position of the substrate W, and therefore the opening 67 evenly spreads radially from the rotational center position. As a result, the liquid film 66 is reliably restrained from being torn.

Second Preferred Embodiment

Figure 8:
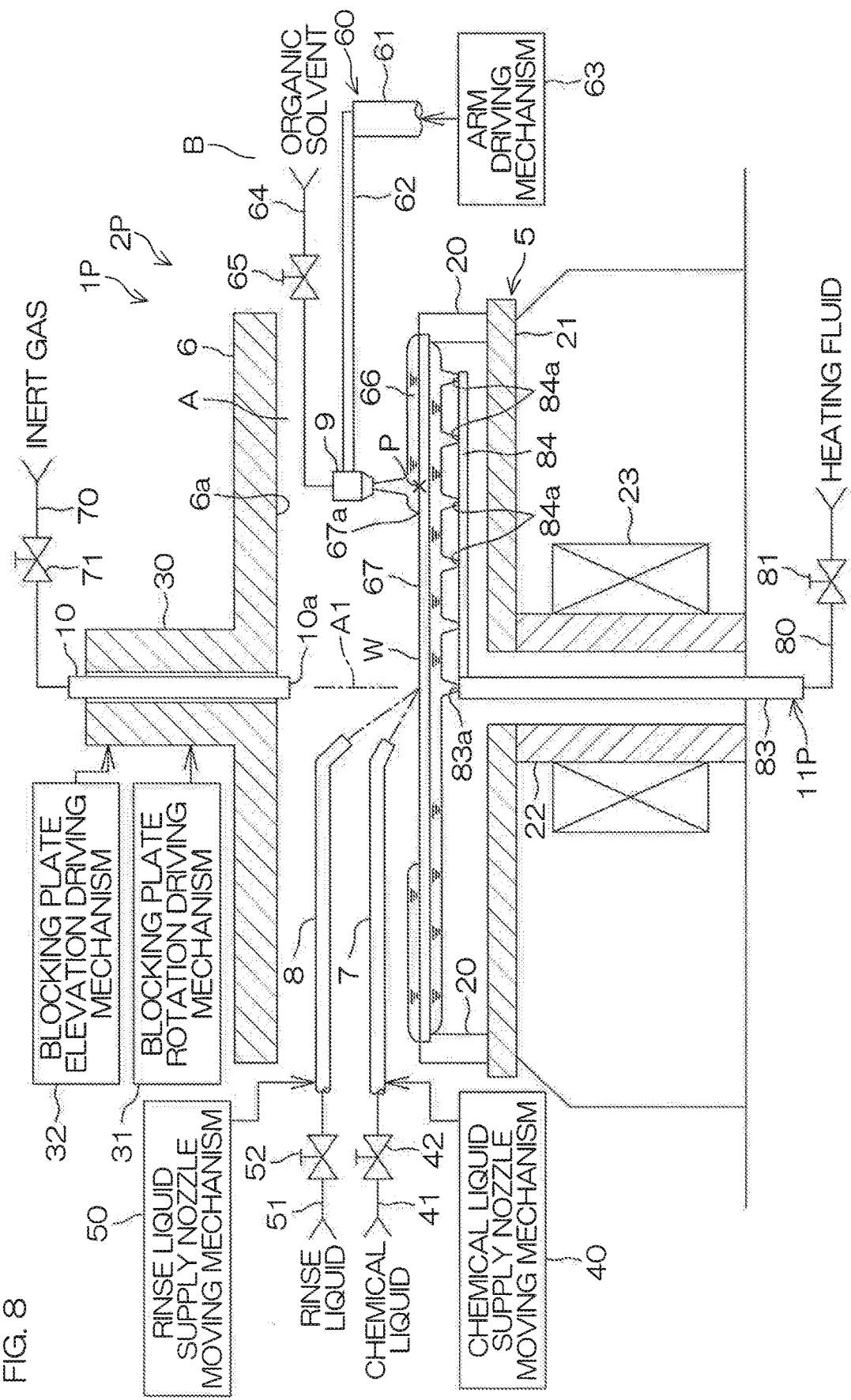
FIG. 8 is a schematic sectional view to describe an arrangement example of a processing unit included in a substrate processing apparatus according to a second preferred embodiment of the present invention.

FIG. 8 is a schematic sectional view to describe an arrangement example of a processing unit 2P included in a substrate processing apparatus 1P according to a second preferred embodiment of the present invention. In FIG. 8 and FIGS. 9 to 13 described later, the same reference sign is given to the same component as each component described above, and a description of the same component is omitted.

With reference to FIG. 8, points in which the processing unit 2P of the second preferred embodiment chiefly differs from the processing unit 2 of the first preferred embodiment shown in FIG. 1 are as follows. The processing unit 2P includes a fluid supply nozzle 11P instead of the fluid supply nozzle 11 of the first preferred embodiment (see FIG. 1). The fluid supply nozzle 11P is included in the substrate heating unit. The fluid supply nozzle 11P includes a center fluid supply nozzle 83 that supplies a heating fluid toward a central area including the rotational center position of the rear surface of the substrate W and an annular fluid supply nozzle 84 that supplies a heating fluid to an annular area ranging from a predetermined position placed outside the central area to the outer periphery of the rear surface of the substrate W.

The center fluid supply nozzle 83 extends in the vertical direction. The center fluid supply nozzle 83 is inserted through the rotational shaft 22. The center fluid supply nozzle 83 has its upper end having a discharge port 83a that faces the center of the rear surface of the substrate W. The annular fluid supply nozzle 84 has a bar-nozzle form that extends from the forward end of the center fluid supply nozzle 83 in the radial direction, and has a plurality of discharge ports 84a facing an annular area of the rear surface of the substrate W. The plurality of discharge ports 84a are disposed at a plurality of positions that differ from each other in the distance from the rotational axis A1, respectively. These discharge ports 84a face the annular area of the rear surface of the substrate W by allowing the substrate W to be rotated around the rotational axis A1.

Heating fluids (for example, warm water) discharged from the discharge port 83a of the center fluid supply nozzle 83 and from the plurality of discharge ports 84a of the annular fluid supply nozzle 84 spread outward along the rear surface of the substrate W by means of a centrifugal force. As a result, a liquid film with which the rear surface of the substrate W is covered is formed. The heating fluids discharged from the plurality of discharge ports 83a and 84a reach positions of the rear surface of the substrate W faced thereby, respectively, and a heat exchange between the heating fluids and the substrate W starts after they reach the positions. Therefore, it is possible to evenly heat the whole area of the substrate W. If the processing unit 2P does not include the annular fluid supply nozzle 84 and includes only the center fluid supply nozzle 83, a heat exchange between the substrate W and a heating fluid starts immediately after the heating fluid reaches the center of the rear surface of the substrate W. Therefore, the heating fluid is deprived of most of the amount of heat by means of the substrate W before the heating fluid reaches the outer periphery of the substrate W. Therefore, the heating of the substrate W does not necessarily become even.

According to the second preferred embodiment, the similar effect as in the first preferred embodiment is fulfilled.

According to the second preferred embodiment, it is possible to evenly heat the substrate W ranging from its center to its outer periphery by means of the fluid supply nozzle 11P. Therefore, it is possible to stably evaporate the organic solvent at the peripheral edge 67a of the opening 67 even when the opening 67 of the liquid film 66 reaches an area near the outer periphery of the substrate W. This makes it possible to excellently assist the enlargement of the opening 67 by heating the substrate W.

The processing unit 2P according to the second preferred embodiment is capable of performing substantially the same substrate processing operation as the processing unit 2 according to the first preferred embodiment, and therefore a description thereof is omitted.

Third Preferred Embodiment

FIG. 9 is a schematic sectional view to describe an arrangement example of a processing unit 2Q included in a substrate processing apparatus 1Q according to a third preferred embodiment of the present invention.

Points in which the processing unit 2Q of the third preferred embodiment chiefly differs from the processing unit 2 of the first preferred embodiment shown in FIG. 1 are as follows. The processing unit 2Q includes a plurality of organic solvent supply nozzles 9Q instead of the organic solvent supply nozzle 9 (see FIG. 1). The organic solvent supply nozzle 9Q is included in the low-surface-tension liquid supply unit. The processing unit 2Q includes a heater 90 that heats the substrate W concentrically with the rotational center of the substrate W. The heater 90 is included in the substrate heating unit.

The plurality of organic solvent supply nozzles 9Q include a center position supply nozzle 100 that supplies an organic solvent toward the rotational center position of the front surface of the substrate W and a plurality of distant-position supply nozzles 105 (a plurality of nozzles) that are respectively disposed at a plurality of positions that differ from each other in the distance from the rotational axis A1 and that supply an organic solvent toward a position away from the rotational center position of the front surface of the substrate W.

The center position supply nozzle 100 is inserted through a hollow center shaft 30Q joined to the blocking plate 6. The center position supply nozzle 100 discharges an organic solvent from a discharge port 100a disposed at its forward end toward the rotational center of the front surface of the substrate W.

In the present preferred embodiment, the plurality of distant-position supply nozzles 105 are arranged side by side along a rotational radial direction R of the substrate W. The plurality of distant-position supply nozzles 105 have their forward ends housed in a plurality of supply ports 68 formed in the facing surface 6a of the blocking plate 6 correspondingly to the plurality of distant-position supply nozzles 105, respectively. An organic solvent discharged from the plurality of distant-position supply nozzles 105 is supplied to the front surface of the substrate W through the supply ports 68. In the present preferred embodiment, the plurality of supply ports 68 are through-holes that pass through the blocking plate 6 in the up-down direction.

An organic solvent supply pipe 101 is joined to the center position supply nozzle 100. An organic solvent valve 102 that opens and closes the flow passage of the organic solvent supply pipe 101 is interposed in the organic solvent supply pipe 101. A plurality of organic solvent supply pipes 106 are joined to the plurality of distant-position supply nozzles 105, respectively, and a plurality of organic solvent valves 107 are interposed in the plurality of organic solvent supply pipes 106, respectively. In other words, an individual organic solvent supply pipe 106 is joined to each distant-position supply nozzle 105, and one organic solvent valve 107 is interposed in the organic solvent supply pipe 106. The plurality of organic solvent valves 107 are included in a supply switching unit that performs switching between supply and non-supply of an organic solvent to a corresponding distant-position supply nozzle 105. At least two distant-position supply nozzles 105 are disposed so that an organic solvent can be supplied from these at least two distant-position supply nozzles 105. The controller 12 is capable of changing the landing position P to at least two positions except the rotational center position by controlling the organic solvent valve 102 and the plurality of organic solvent valves 107. In other words, in the present preferred embodiment, the organic solvent valve 102 and the plurality of organic solvent valves 107 are included in the landing-position changing unit.

An organic solvent from a shared organic solvent supply source may be supplied to the organic solvent supply pipe 101 and to the plurality of organic solvent supply pipes 106. In this case, the plurality of organic solvent supply pipes 106 may branch from the organic solvent supply pipe 101 closer to the organic solvent supply source than to the organic solvent valve 102.

The heater 90 may be, for example, a resistive element that is built in the blocking plate 6 and that extends in the rotational radial direction R. The heater 90 may be formed in an annular shape that surrounds the rotational axis A1, or may be formed in the shape of the letter C in which a part of a circular ring becomes discontinuous in the circumferential direction around the rotational axis A1. In the example of FIG. 9, the heater 90 has a plurality of areas divided in the rotational radial direction R, and is capable of setting an individual temperature depending on each area. The temperature of the heater 90 may be set for each area so that the temperature becomes higher, for example, as going away from the rotational center position of the substrate W. A heater energizing mechanism 91 that raises the temperature of the heater 90 by energizing the heater 90 is connected to the heater 90. The controller 12 is capable of controlling the energizing of the heater 90 by controlling the heater energizing mechanism 91.

It is possible for this processing unit 2Q to perform the processing steps shown in FIG. 4 and FIG. 5 described with respect to the first preferred embodiment. In the following, concerning an example of substrate processing performed by the processing unit 2Q of the third preferred embodiment, only a part (step S3) chiefly differing from the substrate processing performed by the processing unit 2 of the first preferred embodiment will be described, and a description of the same part (step S1, step S2, and step S4) as the substrate processing performed by the processing unit 2 is omitted. Likewise, concerning the organic-solvent processing step (step S3), a description of the same processing as the substrate processing performed by the processing unit 2 of the first preferred embodiment is omitted.

Figure 10A:
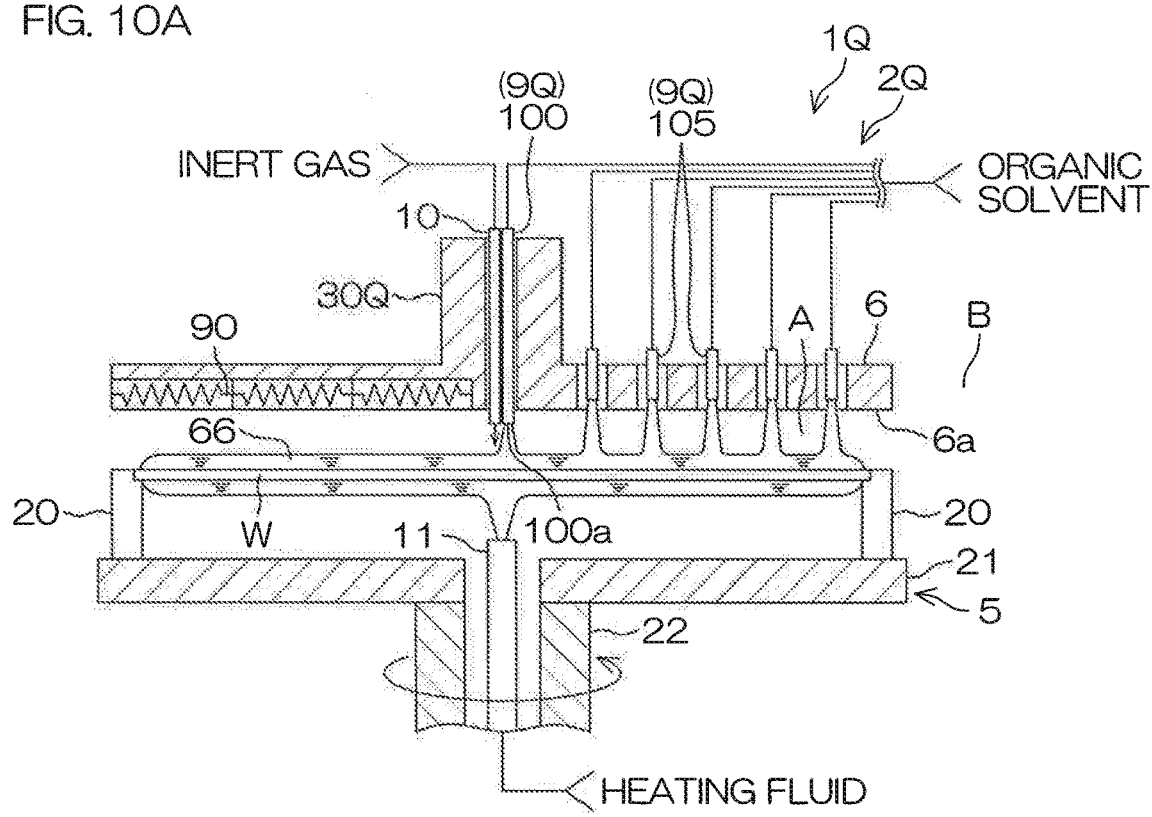
FIG. 10A is a schematic sectional view to describe a situation in which the processing unit according to the third preferred embodiment processes a substrate by use of an organic solvent.
Figure 10B:
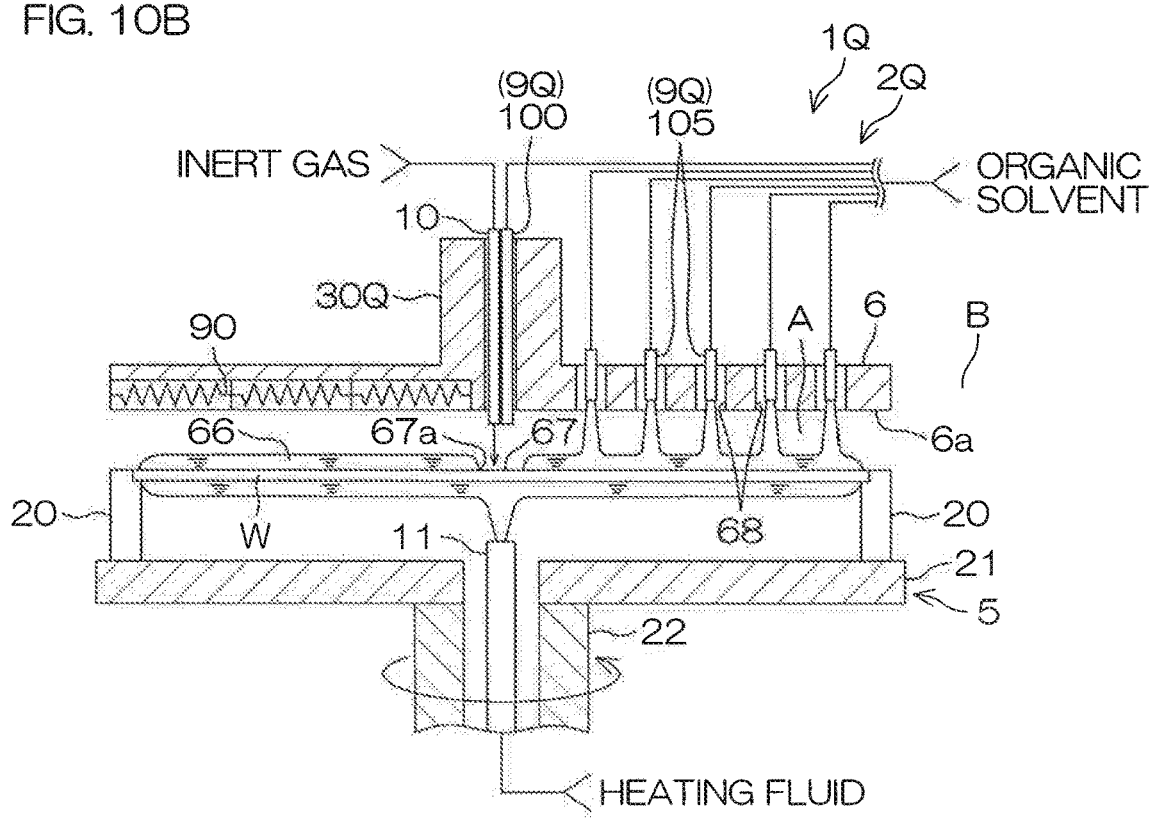
FIG. 10B is a schematic sectional view to describe a situation in which the processing unit according to the third preferred embodiment processes a substrate by use of an organic solvent.
Figure 10C:
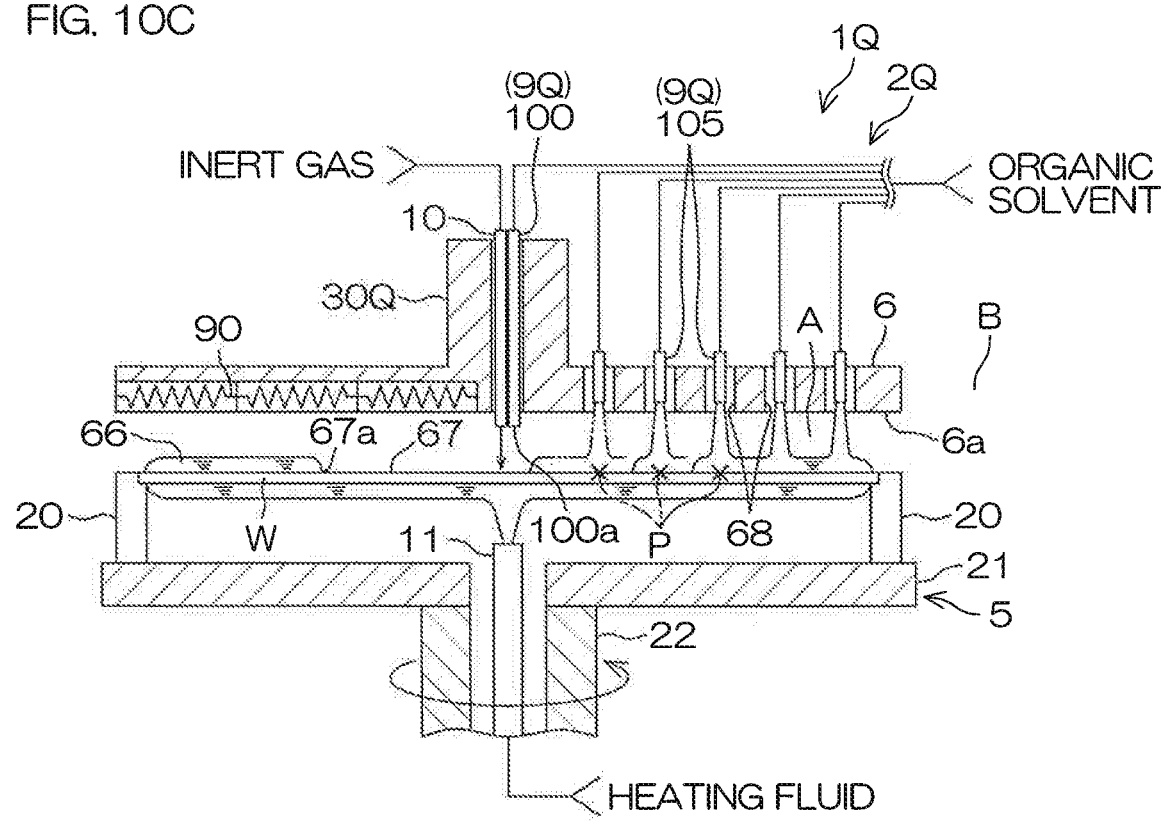
FIG. 10C is a schematic sectional view to describe a situation in which the processing unit according to the third preferred embodiment processes a substrate by use of an organic solvent.

FIG. 10A to FIG. 10C are schematic sectional views, each describing a situation in which the processing unit 2Q according to the third preferred embodiment processes a substrate W by use of an organic solvent. FIG. 10A corresponds to the replacing step T1 and the liquid-film forming step T2 described later. FIG. 10B corresponds to the opening forming step T3 described later. FIG. 10C corresponds to the opening enlarging step T4 and the landing-position changing step T5 described later.

In the organic-solvent processing step, the substrate heating step is performed in parallel. The substrate heating step is performed at least during a period of time during which an organic solvent is supplied to a substrate W, i.e., is performed at least in the organic-solvent processing step S3 (the replacing step T1, the liquid-film forming step T2, the opening forming step T3, the opening enlarging step T4, and the landing-position changing step T5). In the substrate heating step in substrate processing performed by the processing unit 2Q, the controller 12 causes the heater 90 to be energized by controlling the heater energizing mechanism 91. As a result, the temperature of the heater 90 rises. The entire substrate W that is rotating and that is disposed apart from the heater 90 is heated by the heater 90 whose temperature has risen. In the substrate heating step, a heating fluid (for example, warm water) may be supplied to a central area including the rotational center position of the rear surface of the substrate W being rotating. The heating fluid supplied thereto spreads on the entire rear surface of the substrate W by means of a centrifugal force. As a result, the entire substrate W is heated.

Prior to the organic-solvent processing step (step S3), the rinse liquid valve 52 is closed, and the rinse liquid supply nozzle 8 is moved from the rinse liquid supply position to the retreat position in the rinsing step (step S2). After the rinse liquid supply nozzle 8 has retreated thereto, the controller 12 causes the blocking plate 6 to descend to the organic-solvent processing position in the organic-solvent processing step (step S3). Members, such as nozzles, are absent between the blocking plate 6 and the front surface of the substrate W after the rinse liquid supply nozzle 8 has retreated thereto, and therefore it is possible to bring the blocking plate 6 close to the substrate W.

An organic solvent starts to be supplied to the front surface of the substrate W from the center position supply nozzle 100 by allowing the controller 12 to open the organic solvent valve 102 (organic solvent supplying step). As a result, as shown in FIG. 10A, the organic solvent is supplied from the organic solvent supply nozzle 9Q toward the front surface of the substrate W being rotating. At this time, the organic solvent may also be supplied from the distant-position supply nozzle 105 by allowing the controller 12 to further open the organic solvent valve 107. When an organic solvent is supplied to the front surface of the substrate W, the organic solvent supplied thereto spreads on the entire front surface of the substrate W by means of a centrifugal force. As a result, the rinse liquid present on the substrate W is replaced by the organic solvent (replacing step T1). The controller 12 controls the substrate rotation driving mechanism 23 so that the spin base 21 rotates at a predetermined replacing speed. The replacing speed is, for example, 10 rpm. The replacing speed may be about 300 rpm.

When the rinse liquid present on the front surface of the substrate W is completely replaced with the organic solvent, the controller 12 controls the substrate rotation driving mechanism 23 so that the spin base 21 rotates at a predetermined organic-solvent-liquid-film forming speed. The organic-solvent-liquid-film forming speed is, for example, 10 rpm. The rotation speed of the substrate W is low, and therefore the organic solvent supplied to the front surface of the substrate W does not fall off from the substrate W by the centrifugal force. Therefore, the organic solvent supplied to the front surface of the substrate W gathers on the front surface of the substrate W because of surface tension. Thus, a liquid film 66 of the organic solvent is formed on the front surface of the substrate W (liquid-film forming step T2).

An inert-gas supply is increased in order to perform the opening forming step T3 of forming the opening 67 in the liquid film 66 of the organic solvent and the opening enlarging step T4 of enlarging the opening 67 in a direction away from the rotational center position. In detail, the flow rate of an inert gas is increased to a predetermined liquid-film-excluding flow rate by allowing the controller 12 to adjust the inert gas valve 71. The liquid-film-excluding flow rate is, for example, 200 liter/min. The opening 67 is formed in the liquid film 66 by supplying an inert gas having the liquid-film-excluding flow rate toward the rotational center position of the substrate W being rotating (opening forming step T3). The opening 67 has a circular shape that spreads from the rotational center position in a plan view (see FIG. 7A). As shown in FIG. 7B, the opening 67 is enlarged in the direction away from the rotational center position by allowing the inert gas to further continue being supplied (opening enlarging step T4).

In the opening forming step T3 and the opening enlarging step T4, the rotation of the spin base 21 is gradually accelerated by allowing the controller 12 to control the substrate rotation driving mechanism 23. The rotation of the spin base 21 is accelerated until its speed reaches 300 rpm, and is then kept at a speed of 300 rpm during a fixed period of time.

As shown in FIG. 10C, the landing-position changing step T5 is performed to change the landing position P in accordance with the enlargement of the opening 67 so that the landing position P is placed outside the peripheral edge 67a of the opening 67. In the landing-position changing step T5, the controller 12 closes the organic solvent valve 102 when the opening 67 is formed in the liquid film 66. An organic solvent is supplied from the plurality of (at least two) distant-position supply nozzles 105 to the front surface of the substrate W by allowing the controller 12 to control the plurality of organic solvent valves 107 so that each organic solvent valve 107 reaches an open state. Thereafter, in accordance with the enlargement of the opening 67, the controller 12 sequentially closes the organic solvent valves 107 respectively corresponding to the distant-position supply nozzles 105 from the rotational center position side. In order to stop the supply of an organic solvent from the distant-position supply nozzle 105 immediately before the peripheral edge 67a of the opening 67 reaches the landing position P of the organic solvent supplied from the distant-position supply nozzle 105, the controller 12 closes the corresponding organic solvent valve 107. The supply of the organic solvent from all distant-position supply nozzles 105 is stopped immediately before the peripheral edge 67a of the opening 67 reaches the landing position P of an organic solvent supplied from the distant-position supply nozzle 105 that supplies an organic solvent on the outermost side.

In the landing-position changing step T5, without sequentially closing the plurality of organic solvent valves 107 from the rotational center position side, the controller 12 may control the opening and closing of the plurality of organic solvent valves 107 so that an organic solvent is supplied from only the single distant-position supply nozzle 105 suitable for the position of the peripheral edge 67a of the opening 67 being enlarged. The distant-position supply nozzle 105 suitable for the position of the peripheral edge 67a of the opening 67 being enlarged may be the distant-position supply nozzle 105 placed at a position closest to the peripheral edge 67a among the distant-position supply nozzles 105 placed outside the peripheral edge 67a.

According to the third preferred embodiment, the similar effect as in the first preferred embodiment is fulfilled.

According to the third preferred embodiment, it is possible to change the landing position P by means of a simple structure in which switching between supply and non-supply of an organic solvent to a corresponding distant-position supply nozzle 105 is performed by the plurality of organic solvent valves 107.

According to the third preferred embodiment, an organic solvent is supplied to the front surface of the substrate W from the plurality of supply ports 68 respectively corresponding to the plurality of distant-position supply nozzles 105. Therefore, there is no need to secure an interval to dispose the plurality of distant-position supply nozzles 105 between the blocking plate 6 and the substrate W. Therefore, it is possible to supply an organic solvent from the plurality of distant-position supply nozzles 105 in a state in which the blocking plate 6 has been brought close to the substrate W. Therefore, the organic solvent of the liquid film 66 outside the peripheral edge 67a is further restrained from being evaporated.

Fourth Preferred Embodiment

Figure 11:
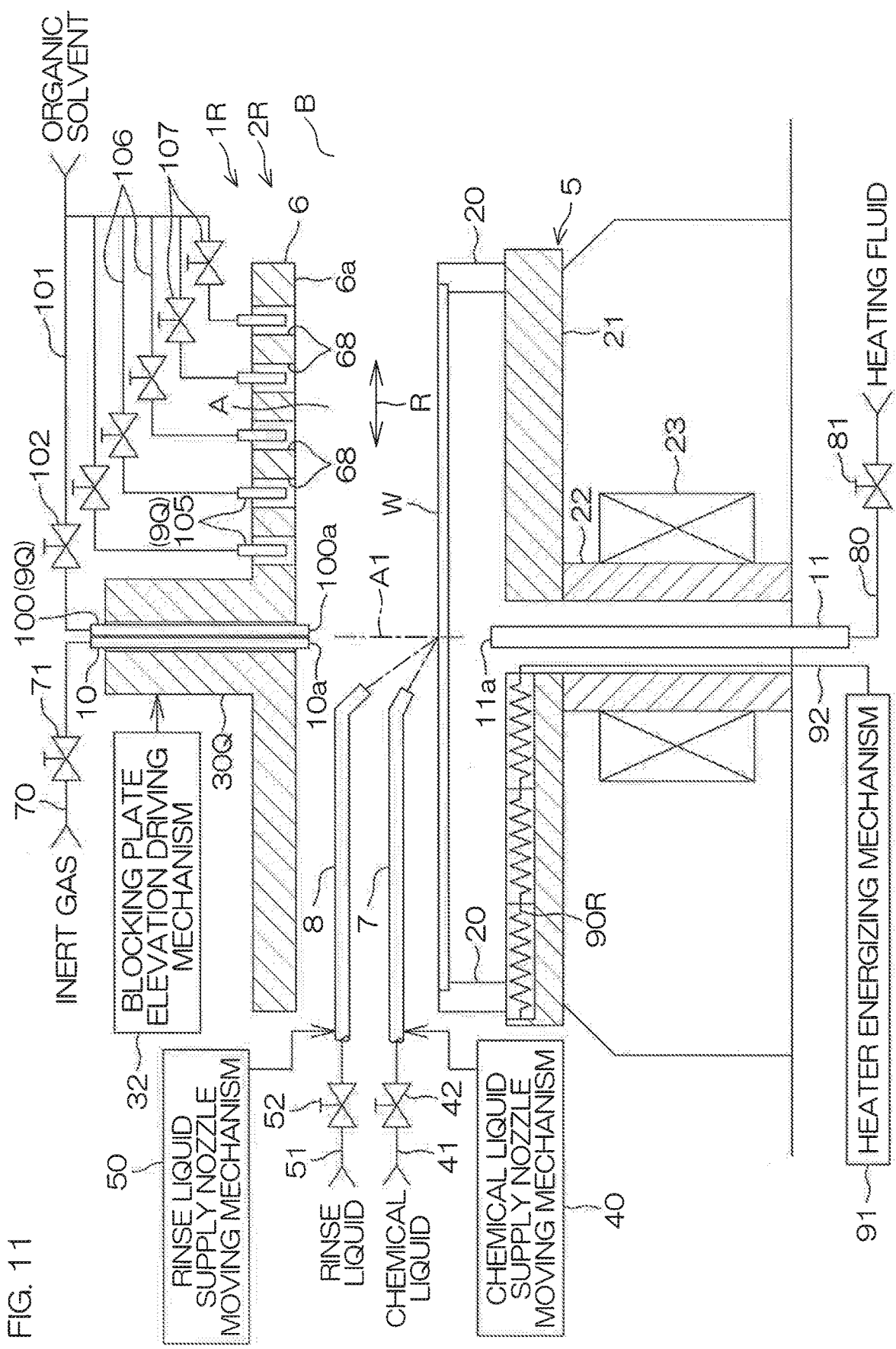
FIG. 11 is a schematic sectional view to describe an arrangement example of a processing unit included in a substrate processing apparatus according to a fourth preferred embodiment of the present invention.

FIG. 11 is a schematic sectional view to describe an arrangement example of a processing unit 2R included in a substrate processing apparatus 1R according to a fourth preferred embodiment of the present invention.

Points in which the processing unit 2R of the fourth preferred embodiment chiefly differs from the processing unit 2Q of the third preferred embodiment shown in FIG. 9 are as follows. The processing unit 2R includes a heater 90R that heats a substrate W from below, instead of the heater 90 (see FIG. 9) of the third preferred embodiment. The heater 90R is included in the substrate heating unit. The heater 90R is, for example, a resistive element that is built in the spin base 21 and that extends in the rotational radial direction R. The heater 90R may be formed in an annular shape that surrounds the rotational axis A1. The heater 90R may be formed in the shape of the letter C in which a part of a circular ring becomes discontinuous in the circumferential direction around the rotational axis A1. In the present preferred embodiment, the heater 90R has a plurality of areas divided in the rotational radial direction R, and is capable of setting an individual temperature depending on each area. The temperature of the heater 90R may be set for each area so that the temperature becomes higher, for example, as going away from the rotational center position of the substrate W. A heater energizing mechanism 91R that raises the temperature of the heater 90R by energizing the heater 90R is connected to the heater 90R. Electric power from the heater energizing mechanism 91R is supplied to the heater 90R through an electric supply line 92 laid in the rotational shaft 22. The controller 12 is capable of controlling the energizing of the heater 90R by controlling the heater energizing mechanism 91R.

According to the fourth preferred embodiment, the similar effect as in the third preferred embodiment is fulfilled.

The processing unit 2R according to the fourth preferred embodiment is capable of performing substantially the same substrate processing operation as the processing unit 2Q according to the third preferred embodiment, and therefore a description of the processing unit 2R is omitted.

The present invention is not limited to the preferred embodiments described above, and can be embodied in other modes.

Figure 12:
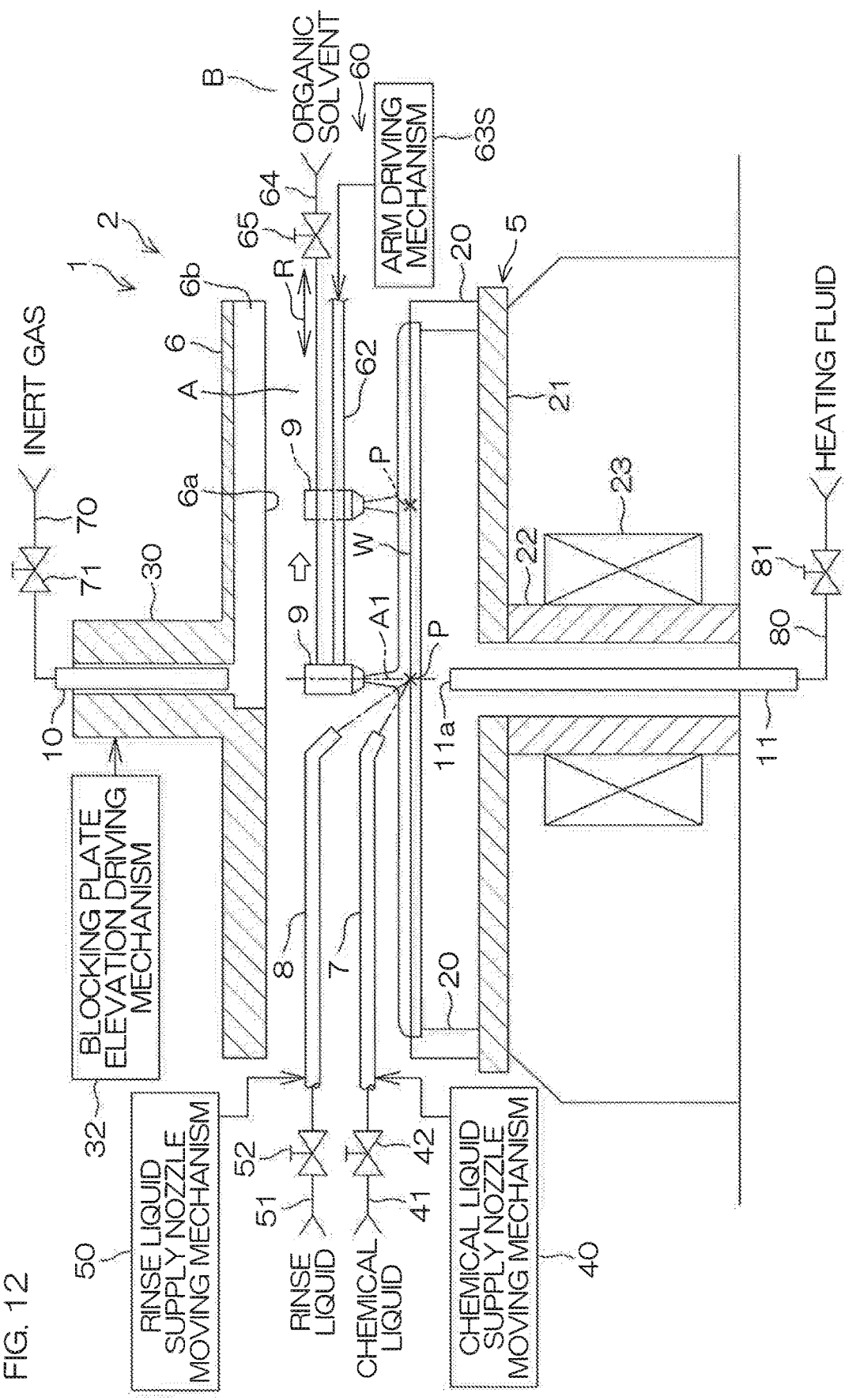
FIG. 12 is a schematic sectional view to describe a modification of the processing unit of the first preferred embodiment.

For example, FIG. 12 shows a processing unit 2 according to a modification of the first preferred embodiment. In this processing unit 2, the organic-solvent-supply-nozzle moving mechanism 60 includes an arm driving mechanism 63S that linearly moves the arm 62 in a direction (rotational radial direction R) in which the arm 62 extends. The arm driving mechanism 63S is included in a nozzle moving unit that moves the organic solvent supply nozzle 9 in the rotational radial direction R of the substrate W along the front surface of the substrate W. The arm driving mechanism 63S is included in a landing-position changing unit that changes the landing position P in the rotational radial direction R of the substrate W along the front surface of the substrate W.

Figure 13:
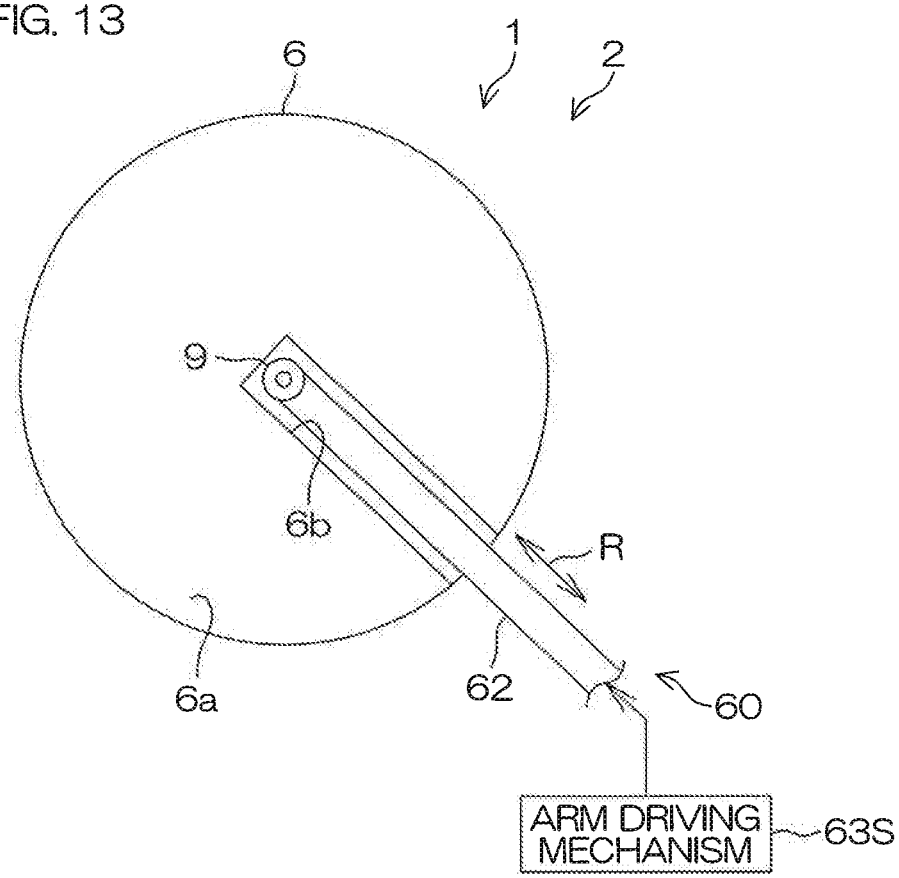
FIG. 13 is a schematic bottom view showing an arrangement near a blocking plate included in the processing unit of FIG. 12.

In this case, as shown by the bottom view in FIG. 13, a groove-shaped cutout 6b that linearly extends along the movement path of the organic solvent supply nozzle 9 may be formed so as to be opened toward the facing surface 6a of the blocking plate 6. Thereby, the organic solvent supply nozzle 9 and the arm 62 can move linearly in the cutout 6b, and does not interfere with the blocking plate 6 in its movement. Before starting the organic-solvent processing step (step S3), the chemical liquid supply nozzle 7 and the rinse liquid supply nozzle 8 have receded from a space between the substrate W and the blocking plate 6. Therefore, it is possible to dispose the blocking plate 6 at a position close to the lower position even if the organic solvent supply nozzle 9 is positioned at any place between the central position and the retreat position. Therefore, it is possible to dispose the blocking plate 6 at a position at which the blocking plate 6 has approached the substrate W in the organic-solvent processing step (step S3). This makes it possible to more effectively block (isolate) an atmosphere near the front surface of the substrate W from its surroundings.

This modification is also applicable to the second preferred embodiment.

As mentioned above, FIG. 9 (third preferred embodiment) shows an arrangement in which the plurality of distant-position supply nozzles 105 supply an organic solvent to the front surface of the substrate W through the supply ports 68 formed in the blocking plate 6. However, instead of the provision of the supply ports 68 in the blocking plate 6, the plurality of distant-position supply nozzles 105 may be held between the facing surface 6a of the blocking plate 6 and the upper surface of the substrate W. In this case, an interval that enables the distant-position supply nozzle 105 to be disposed is required to be secured between the facing surface 6a and the substrate W when an organic solvent is supplied. However, on the other hand, if the blocking-plate-rotation driving mechanism 31 (see FIG. 1) is provided, the blocking-plate-rotation driving mechanism 31 can rotate the blocking plate 6. This makes it possible to shake off liquid droplets adhering to the facing surface 6a by means of a centrifugal force.

Additionally, the plurality of distant-position supply nozzles 105 may be integrally incorporated in the blocking plate 6. For example, a plurality of discharge ports may be formed by forming a plurality of organic-solvent flow passages inside the blocking plate 6 and by opening the plurality of organic-solvent flow passages in the facing surface 6a at positions that differ from each other in the distance from the rotational axis A1. It is possible to selectively discharge an organic solvent from the plurality of discharge ports by controlling the supply of the organic solvent to each organic solvent supply passage.

Additionally, although, in the liquid-film forming step T2 of the organic-solvent processing step (step S3), the substrate rotation speed is decreased to substantially 10 rpm from substantially 10 to 300 rpm employed when the replacing step T1 is performed as described above, the substrate rotation speed is not necessarily required to be decreased in the liquid-film forming step T2. For example, the substrate rotation speed employed in the replacing step T1 may be maintained in the liquid-film forming step T2.

The present application corresponds to Japanese Patent Application No. 2015-252297 filed in the Japan Patent Office on Dec. 24, 2015, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method comprising:
a processing-liquid supply step of supplying a processing liquid including water to a substrate held horizontally;
a replacing step of replacing the processing liquid by supplying a low-surface-tension liquid that has surface tension lower than water to the substrate;
an atmosphere shielding step in which a facing member, which has a facing surface facing a front surface of the substrate, is positioned at a processing position between a lower position close to the substrate and an upper position above the lower position by an elevation driving mechanism which elevates the facing member in a vertical direction, so that a space between the facing member and the front surface of the substrate is shielded from an ambient atmosphere;
a liquid-film forming step in which, in a state where the facing member is positioned at the processing position and a low-surface-tension liquid nozzle is positioned between the facing surface and the front surface of the substrate, the low-surface-tension liquid is discharged from the low-surface-tension liquid nozzle, so that a liquid film of the low-surface-tension liquid is formed on the front surface of the substrate, the low-surface-tension liquid nozzle being connected to an arm which is driven by an arm driving mechanism;
an opening forming step in which, while rotating the substrate around a predetermined rotational axis that extends in the vertical direction, an inert gas is discharged from an inert gas nozzle, which has a single discharge port exposed from the facing surface and facing a rotational center position that is a position centered on the rotational axis on the front surface of the substrate, so that an opening, that spreads from the rotational center position, is formed in the liquid film of the low-surface-tension liquid;
an opening enlarging step of enlarging the opening in a radial direction away from the rotational center position by continuing discharge of the inert gas from the inert gas nozzle; and
a landing-position changing step wherein, by moving the low-surface-tension liquid nozzle by the arm driving mechanism such that a landing position on the front surface of the substrate on which the low-surface-tension-liquid lands is placed outside a peripheral edge of the opening, the landing position is moved successively to at least two positions radially spaced from the rotational center position in accordance with enlargement of the opening, wherein respective distances from the rotational center position to the at least two positions are different,
wherein the low-surface-tension liquid nozzle is maintained between the facing surface and the front surface of the substrate and the facing member is maintained at the processing position, from a time at which discharging the low-surface-tension liquid from the low-surface-tension liquid nozzle is started in the liquid-film forming step until an entirety of the liquid film of the low-surface-tension liquid is excluded from the front surface of the substrate in the opening enlarging step,
the liquid film of the low-surface-tension liquid is formed, while supplying the inert gas from the inert gas nozzle to the space between the front surface of the substrate and the facing surface, and
after the liquid film of the low-surface-tension liquid is formed on the front surface of the substrate, the opening is formed in the liquid film of the low-surface-tension liquid by increasing a flow rate of the inert gas which is discharged from the inert gas nozzle.

2. The substrate processing method according to claim 1, wherein the landing-position changing step includes a step of moving the landing position so that a distance between the peripheral edge of the opening and the landing position is kept constant.

3. The substrate processing method according to claim 1, wherein the landing-position changing step includes a step of moving the low-surface-tension liquid nozzle in a direction along the front surface of the substrate.

4. The substrate processing method according to claim 1, wherein at least the replacing step, the liquid-film forming step, and the landing-position changing step include a step of heating the substrate.

5. The substrate processing method according to claim 1, wherein the landing-position changing step includes a step of changing the landing position in a direction away from the rotational center position.

6. The substrate processing method according to claim 3, wherein the landing-position changing step includes a step of moving the low-surface-tension liquid nozzle continuously in a direction away from the rotational center position in accordance with enlargement of the opening, such that a distance between the peripheral edge of the opening and the landing position is kept constant.

7. The substrate processing method according to claim 4, wherein the step of heating the substrate includes a step in which the substrate is heated by a heater which is disposed so as to face the substrate.

8. The substrate processing method according to claim 4, wherein the step of heating the substrate includes a step of supplying a heating fluid, which heats the substrate, toward a back surface, of the substrate, which is a surface opposite the front surface to which the processing liquid and the low-surface-tension liquid are supplied.

9. The substrate processing method according to claim 1, wherein the liquid-film forming step includes a step of forming the liquid film of the low-surface-tension liquid on the front surface of the substrate while rotating the substrate around the rotational axis,
the opening enlarging step includes a step of enlarging the opening while rotating the substrate around the rotational axis, and
the method further comprises a step of accelerating rotation of the substrate during execution of the opening forming step such that a rotation speed of the substrate in the opening enlarging step is higher than a rotation speed of the substrate in the liquid-film forming step.

10. The substrate processing method according to claim 1, wherein the lower position is a position of the facing member when the facing surface is placed 0.5 mm to 2.5 mm above the front surface of the substrate,
the upper position is a position of the facing member when the facing surface is placed 150 mm above the front surface of the substrate, and
the processing position is a position of the facing member when the facing surface is placed 15 mm above the front surface of the substrate.

11. A substrate processing method comprising:
a processing-liquid supply step of supplying a processing liquid including water to a substrate held horizontally;
a replacing step of replacing the processing liquid by discharging a low-surface-tension liquid that has surface tension lower than water toward a front surface of the substrate from at least one of a plurality of nozzles having forward ends which are respectively housed in a plurality of through holes so as to face the front surface of the substrate, wherein the through holes vertically penetrate a facing member which has a facing surface facing an entirety of the front surface of the surface;
a liquid-film forming step of forming a liquid film of the low-surface-tension liquid on the front surface of the substrate by supplying the low-surface-tension liquid to at least one landing position on the front surface of the substrate from at least one of the plurality of the nozzles;
an atmosphere shielding step in which the facing member is raised and lowered in a vertical direction to shield a space between the facing surface and the front surface of the substrate from an ambient atmosphere;
an opening forming step of forming an opening, that spreads from a rotational center position that is a position centered on a predetermined rotational axis on the front surface of the substrate, in the liquid film of the low-surface-tension liquid, while rotating the substrate around the rotational axis that extends in the vertical direction; and
an opening enlarging step of enlarging the opening in a radial direction away from the rotational center position,
wherein the plurality of the through holes are respectively formed at a plurality of positions having different distances from the rotational center position,
the method further comprises a landing-position changing step wherein at least one of the plurality of the nozzles that discharges the low-surface-tension liquid is switched such that the landing positions on the front surface of the substrate are placed outside a peripheral edge of the opening, so that the landing positions are changed to at least two positions radially spaced from the rotational center position in accordance with enlargement of the opening, wherein respective distances from the rotational center position to the at least two positions are different, the liquid-film forming step includes a step of forming the liquid film by discharging the low-surface-tension liquid from all the nozzles toward the front surface of the substrate, and the landing-position changing step of closing sequentially a plurality of switching valves, which switch the presence or absence of discharge of the low-surface-tension liquid from the plurality of the nozzles, in accordance with enlargement of the opening, so that discharge of the low-surface-tension liquid from all the nozzles, which are positioned inside the peripheral edge of the opening, of the plurality of the nozzles is stopped to change the landing positions such that at least one of the landing positions is positioned outside the peripheral edge of the opening.

12. The substrate processing method according to claim 11, wherein at least the replacing step, the liquid-film forming step, and the landing-position changing step include a step of heating the substrate.

13. The substrate processing method according to claim 11, wherein the plurality of the nozzles which are arranged side by side along a rotational radial direction of the substrate.

14. The substrate processing method according to claim 12, wherein the step of heating the substrate includes a step in which the substrate is heated by a heater which is disposed so as to face the substrate.

15. The substrate processing method according to claim 12, wherein the step of heating the substrate includes a step of supplying a heating fluid, which heats the substrate, toward a back surface, of the substrate, which is a surface opposite the front surface to which the processing liquid and the low-surface-tension liquid are supplied.

16. The substrate processing method according to claim 11, wherein the liquid-film forming step includes a step of forming the liquid film of the low-surface-tension liquid on the front surface of the substrate while rotating the substrate around the rotational axis, the opening enlarging step includes a step of enlarging the opening while rotating the substrate around the rotational axis, and the method further comprises a step of accelerating rotation of the substrate during execution of the opening forming step such that a rotation speed of the substrate in the opening enlarging step is higher than a rotation speed of the substrate in the liquid-film forming step.

* * * * *